(12) United States Patent
Kuwabara et al.

(10) Patent No.: US 7,833,851 B2
(45) Date of Patent: Nov. 16, 2010

(54) SEMICONDUCTOR DEVICE AND MANUFACTURING METHOD THEREOF

(75) Inventors: Hideaki Kuwabara, Atsugi (JP); Koichiro Tanaka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 129 days.

(21) Appl. No.: 11/987,311

(22) Filed: Nov. 29, 2007

(65) Prior Publication Data

US 2008/0090344 A1     Apr. 17, 2008

Related U.S. Application Data

(62) Division of application No. 10/294,032, filed on Nov. 14, 2002, now Pat. No. 7,306,981.

(30) Foreign Application Priority Data

Nov. 16, 2001   (JP) .............................. 2001-352046

(51) Int. Cl.
*H01L 21/84* (2006.01)
(52) U.S. Cl. ..................... 438/166; 438/154; 438/157; 438/158; 257/E21.412
(58) Field of Classification Search ................ 438/154, 438/157, 158, 166, 365, 478; 257/E21.412
See application file for complete search history.

(56) References Cited

U.S. PATENT DOCUMENTS

| | | | |
|---|---|---|---|
| 4,599,133 A | 7/1986 | Miyao et al. |
| 4,692,994 A | 9/1987 | Moniwa et al. |
| 4,959,697 A | 9/1990 | Shier et al. |
| 4,999,682 A | 3/1991 | Xu et al. |
| 5,028,976 A | 7/1991 | Ozaki et al. |
| 5,095,347 A | 3/1992 | Kirsch |
| 5,210,437 A | 5/1993 | Sawada et al. |
| 5,266,507 A | 11/1993 | Wu |
| 5,355,022 A | 10/1994 | Sugahara et al. |
| 5,489,792 A | 2/1996 | Hu et al. |

(Continued)

FOREIGN PATENT DOCUMENTS

EP        0 199 388        10/1986

(Continued)

*Primary Examiner*—Alexander G Ghyka
*Assistant Examiner*—Seahvosh J Nikmanesh
(74) *Attorney, Agent, or Firm*—Eric J. Robinson; Robinson Intellectual Property Law Office, P.C.

(57) ABSTRACT

It is an object of the invention that, in semiconductor device, in order to promote the tendency of miniaturization of each display pixel pitch, which will be resulted in with the tendency toward the higher precision (increase of pixel number) and further miniaturizations, a plurality of elements is formed within a limited area and the area occupied by the elements is compacted so as to be integrated. A plurality of semiconductor layers 13, 15 is formed on different layers with insulating film 14 sandwiched therebetween. After carrying out crystallization by means of laser beam, on each semiconductor layer (semiconductor layers 16, 17 having crystal structure respectively), an N-channel type TFT of inversed stagger structure and a P-channel type TFT 30 of top gate structure are formed respectively and integrated so that the size of CMOS circuit is miniaturized.

5 Claims, 18 Drawing Sheets

U.S. PATENT DOCUMENTS

| | | | |
|---|---|---|---|
| 5,504,376 A | 4/1996 | Sugahara et al. | |
| 5,548,147 A | 8/1996 | Mei | |
| 5,563,440 A | 10/1996 | Yamazaki et al. | |
| 5,604,137 A | 2/1997 | Yamazaki et al. | |
| 5,619,044 A | 4/1997 | Makita et al. | |
| 5,644,147 A | 7/1997 | Yamazaki et al. | |
| 5,773,340 A | 6/1998 | Kumauchi et al. | |
| 5,781,445 A | 7/1998 | Shiue et al. | |
| 5,807,771 A | 9/1998 | Vu et al. | |
| 5,807,772 A | 9/1998 | Takemura | |
| 5,818,070 A | 10/1998 | Yamazaki et al. | |
| 5,894,137 A | 4/1999 | Yamazaki et al. | |
| 5,917,221 A | 6/1999 | Takemura | |
| 6,066,516 A | 5/2000 | Miyasaka | |
| 6,111,296 A | 8/2000 | Yamazaki et al. | |
| 6,121,660 A | 9/2000 | Yamazaki et al. | |
| 6,127,702 A | 10/2000 | Yamazaki et al. | |
| 6,184,556 B1 | 2/2001 | Yamazaki et al. | |
| 6,191,442 B1 | 2/2001 | Matsufusa | |
| 6,215,130 B1 | 4/2001 | Dodabalapur | |
| 6,218,714 B1 | 4/2001 | Yamazaki | |
| 6,320,213 B1 * | 11/2001 | Kirlin et al. | 257/295 |
| 6,340,830 B1 | 1/2002 | Takemura | |
| 6,528,852 B2 | 3/2003 | Takemura | |
| 6,537,864 B1 | 3/2003 | Aya et al. | |
| 6,602,765 B2 | 8/2003 | Jiroku et al. | |
| 6,639,246 B2 | 10/2003 | Honda | |
| 6,680,223 B1 | 1/2004 | Yamazaki et al. | |
| 6,740,938 B2 | 5/2004 | Tsunoda et al. | |
| 6,815,772 B2 | 11/2004 | Takemura | |
| 6,841,434 B2 * | 1/2005 | Miyairi et al. | 438/166 |
| 6,924,528 B2 | 8/2005 | Yamazaki et al. | |
| 6,982,194 B2 | 1/2006 | Tsunoda et al. | |
| 7,230,601 B2 | 6/2007 | Yamazaki et al. | |
| 2001/0003659 A1 * | 6/2001 | Aya et al. | 438/166 |
| 2003/0015703 A1 | 1/2003 | Yamazaki et al. | |
| 2003/0025166 A1 | 2/2003 | Yamazaki et al. | |
| 2003/0075733 A1 | 4/2003 | Yamazaki et al. | |
| 2004/0056253 A1 | 3/2004 | Honda | |

FOREIGN PATENT DOCUMENTS

| | | |
|---|---|---|
| EP | 0 506 089 | 9/1992 |
| EP | 0 553 774 | 8/1993 |
| JP | 61-222254 | 10/1986 |
| JP | 61-226916 | 10/1986 |
| JP | 04-068565 | 3/1992 |
| JP | 05-198739 | 8/1993 |
| JP | 05-206422 | 8/1993 |
| JP | 05-257169 | 10/1993 |
| JP | 05-335482 | 12/1993 |
| JP | 08-102501 | 4/1996 |
| JP | 10-93099 | 4/1998 |
| JP | 10-93100 | 4/1998 |
| JP | 10-150202 | 6/1998 |
| JP | 10-270359 | 10/1998 |
| JP | 11-40772 | 2/1999 |
| JP | 2000-505241 | 4/2000 |
| JP | 2001-189458 | 7/2001 |
| WO | WO 88/03328 | 5/1988 |
| WO | WO 97/45827 | 12/1997 |

* cited by examiner

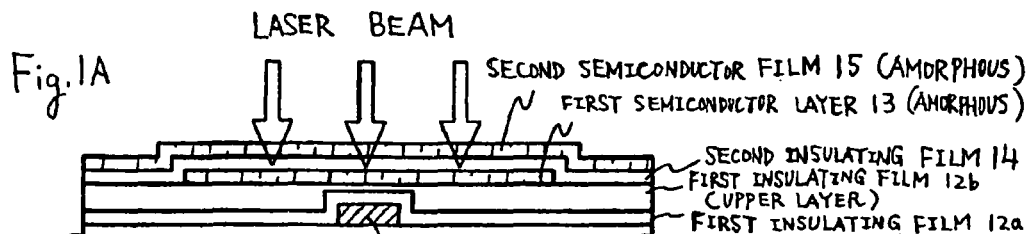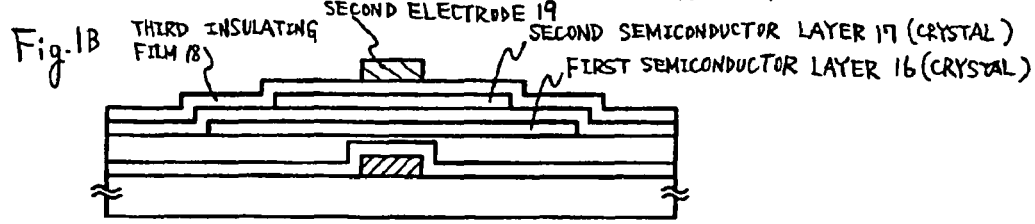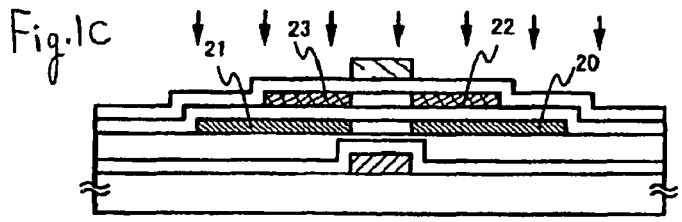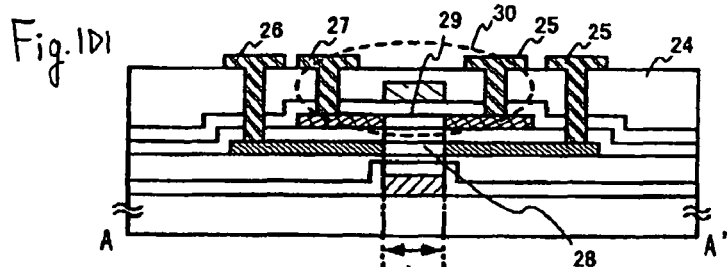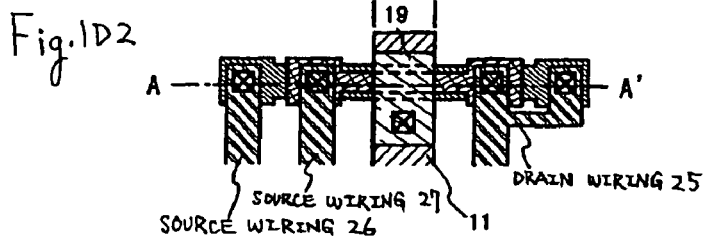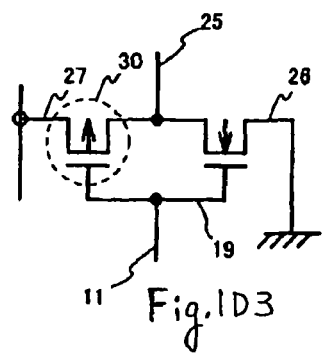

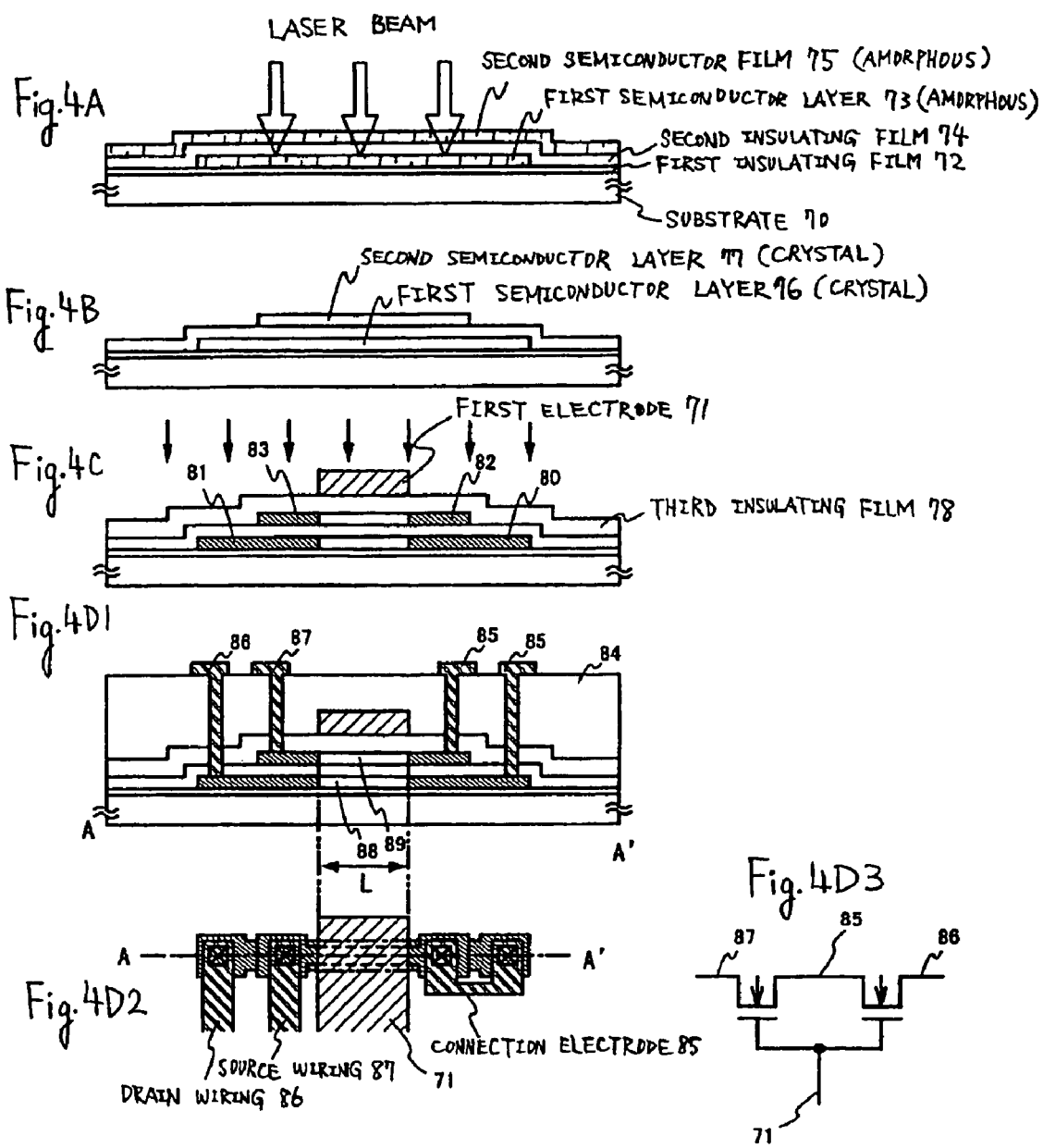

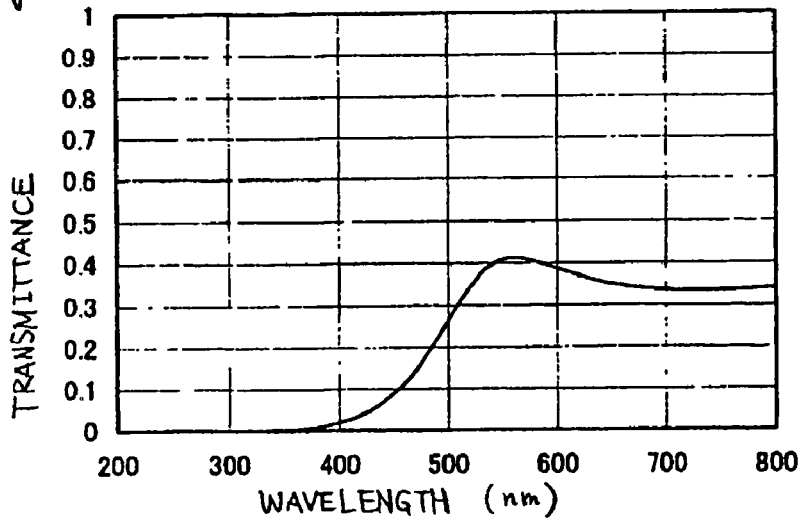
Fig. 6A TRANSMITTANCE IN AMORPHOUS SILICON (55nm IN THICKNESS)
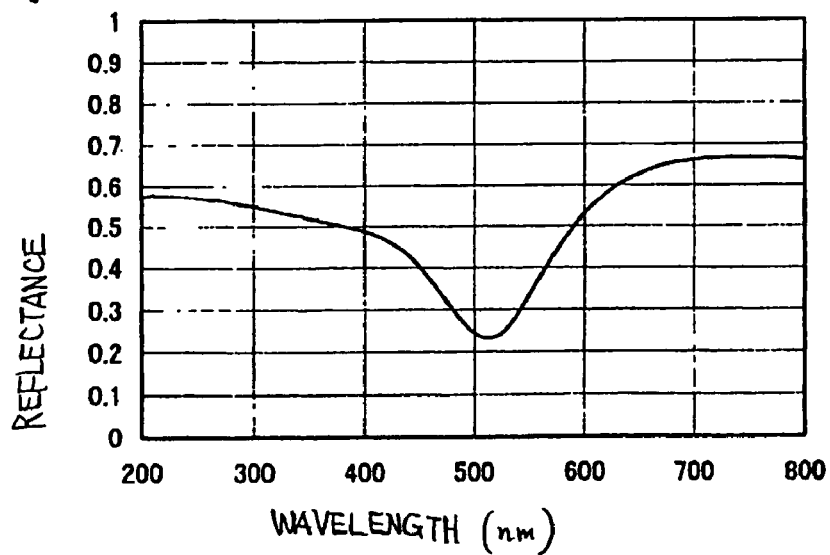
Fig. 6B REFLECTANCE IN AMORPHOUS SILICON (55nm IN THICKNESS)

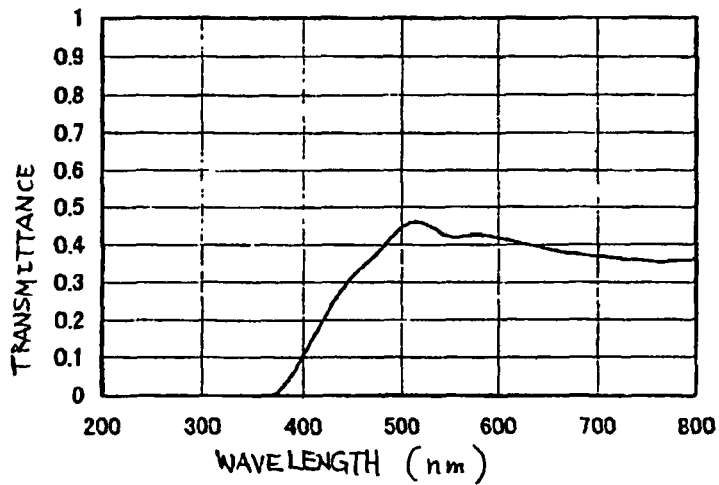
Fig. 7A TRANSMITTANCE IN POLYSILICON FILM (55nm IN THICKNESS)
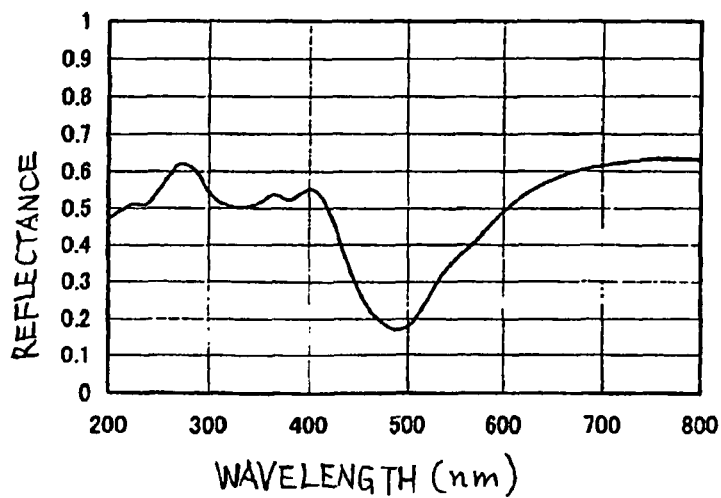
Fig. 7B REFLECTANCE IN POLYSILICON FILM (55nm IN THICKNESS)

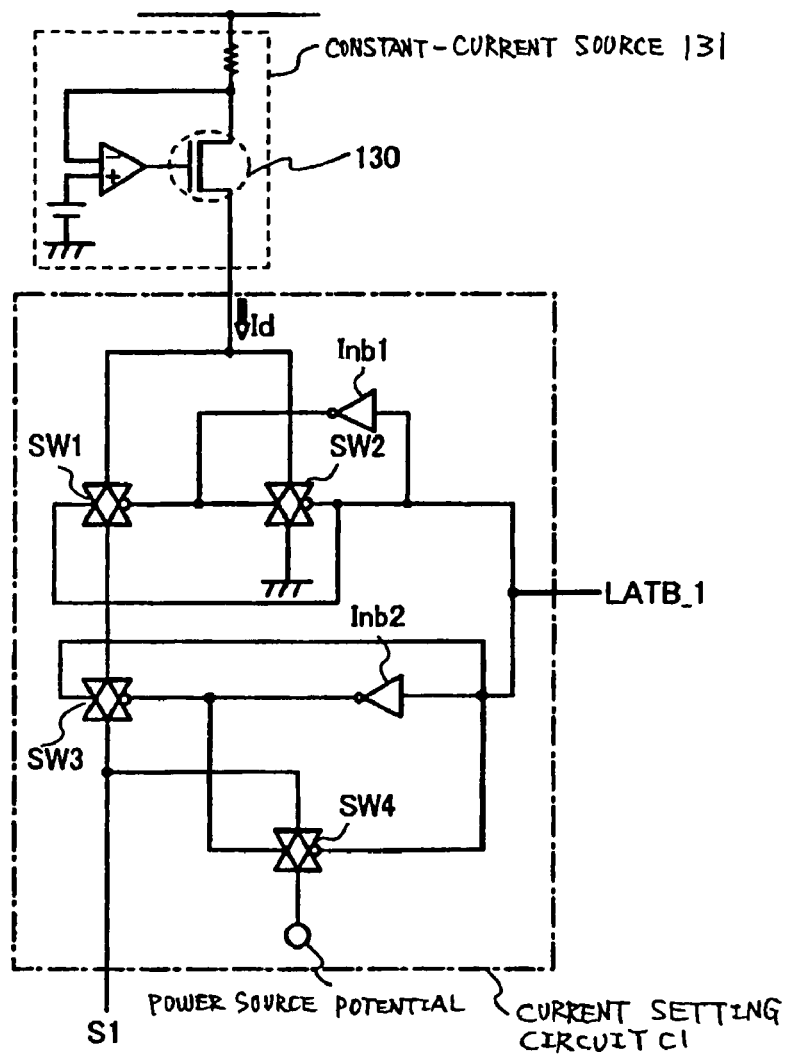
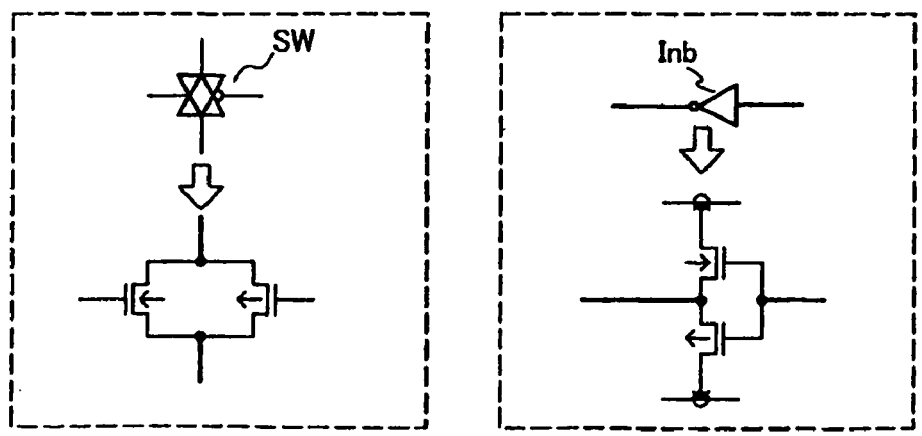

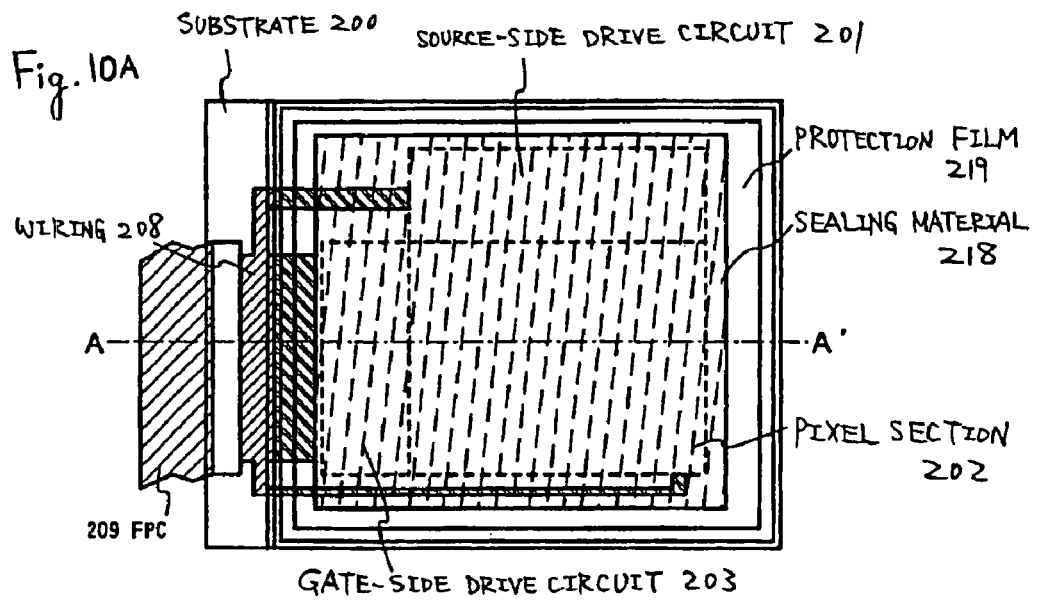
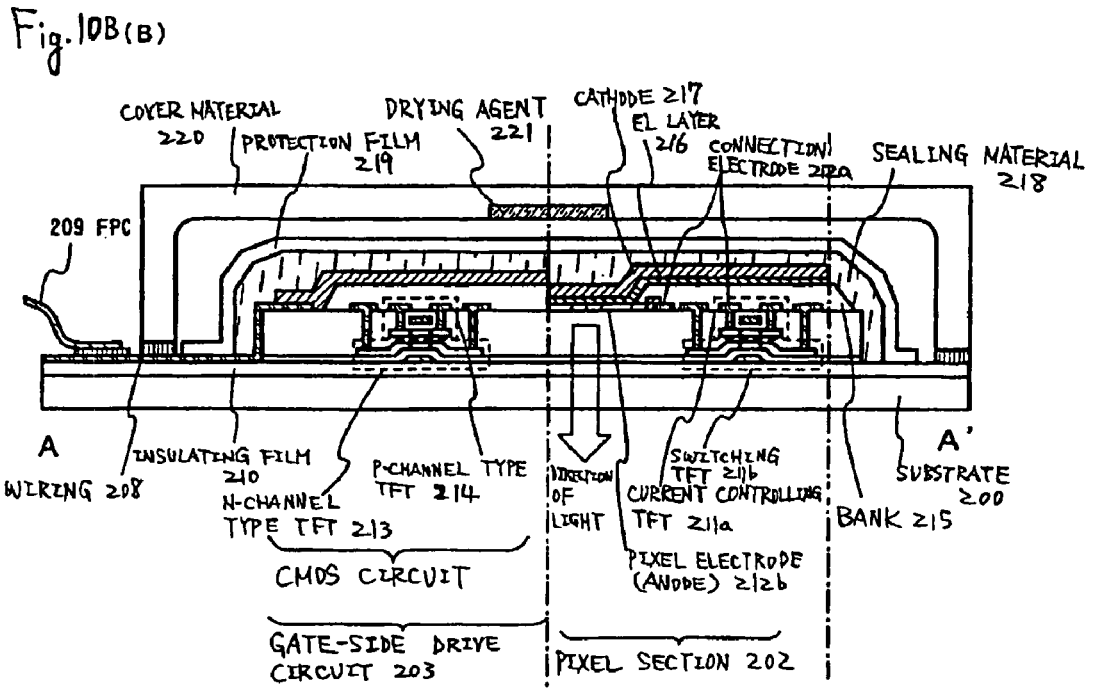

411, 412, 413, 414: TFT
415: HOLDING CAPACITY
416: OLED
417: CURRENT SOURCE
418, 419, 420, 421: TERMINAL 431, 432, 433, 434: TFT
435: HOLDING CAPACITY
436: OLED
437: CURRENT SOURCE
438, 39, 40, 41: TERMINAL

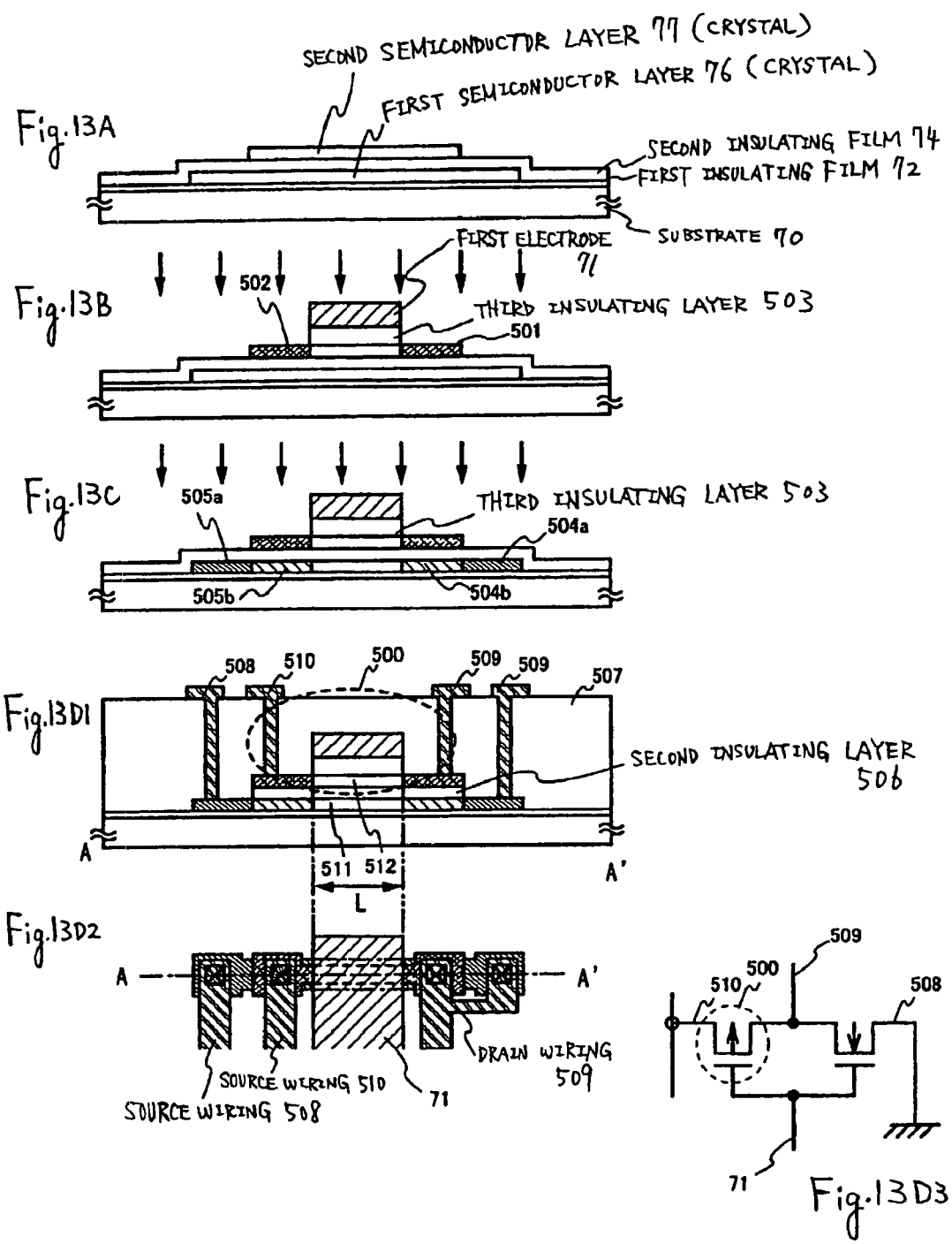

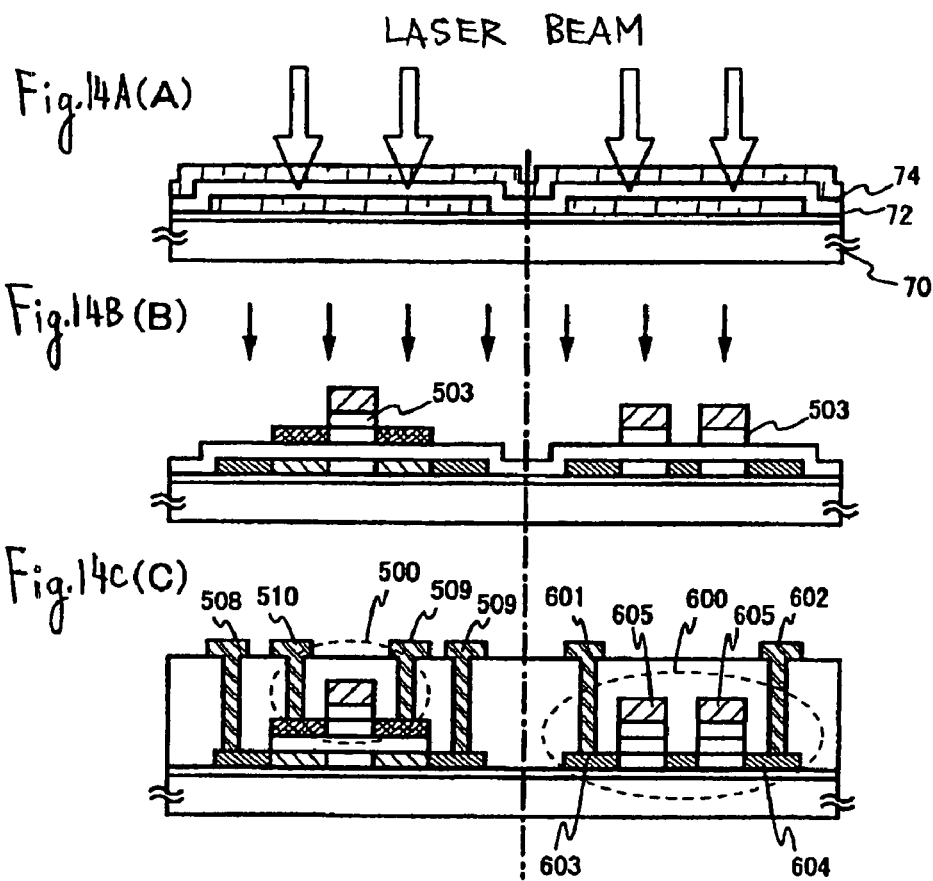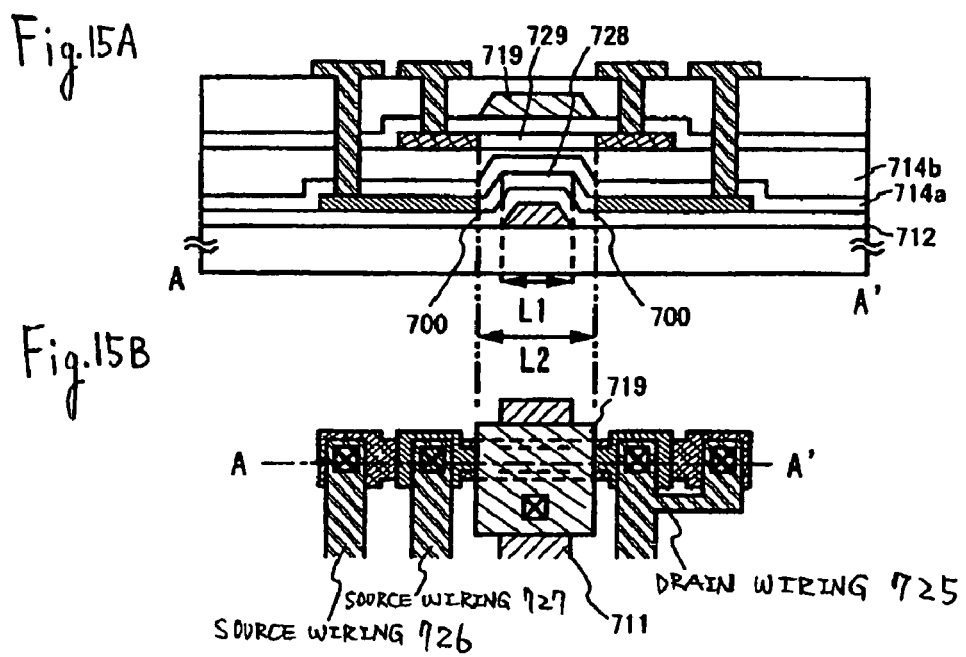

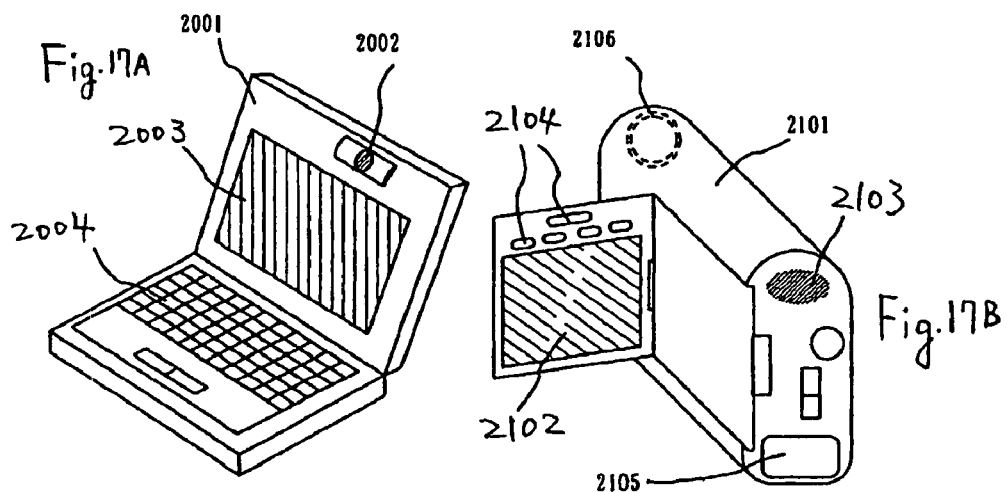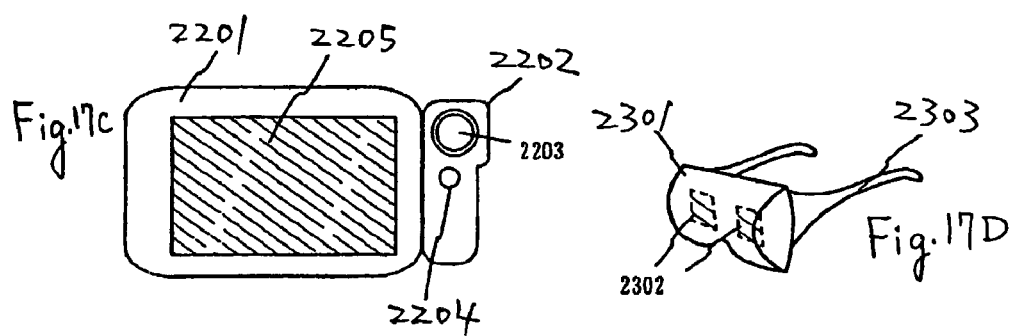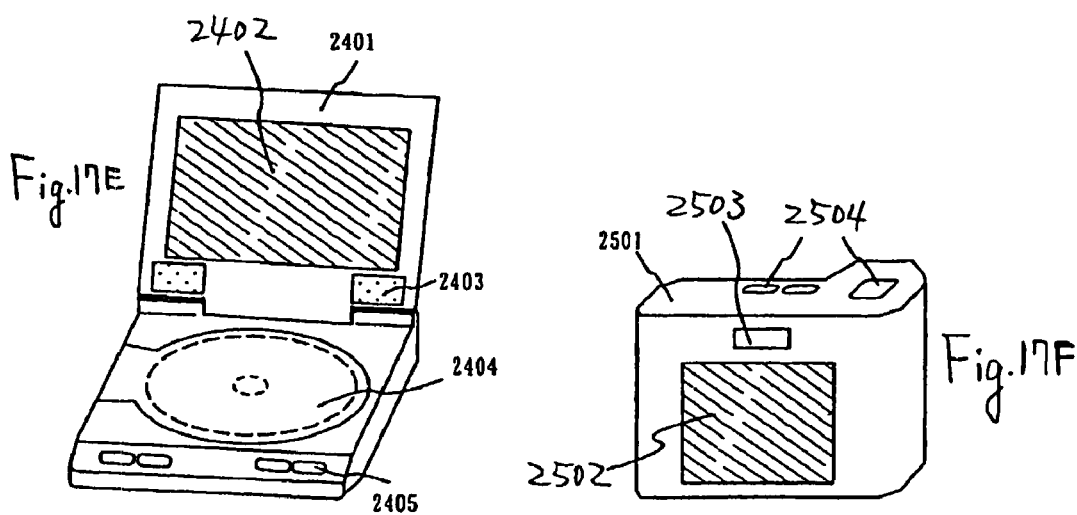

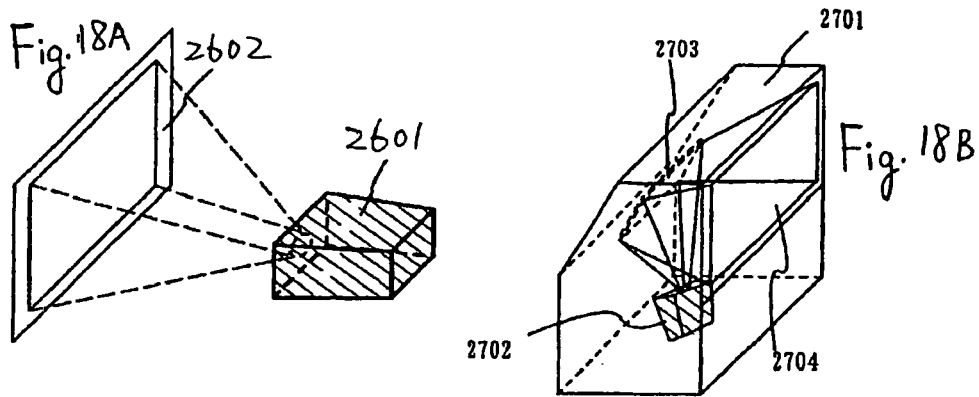
Fig. 18A
Fig. 18B
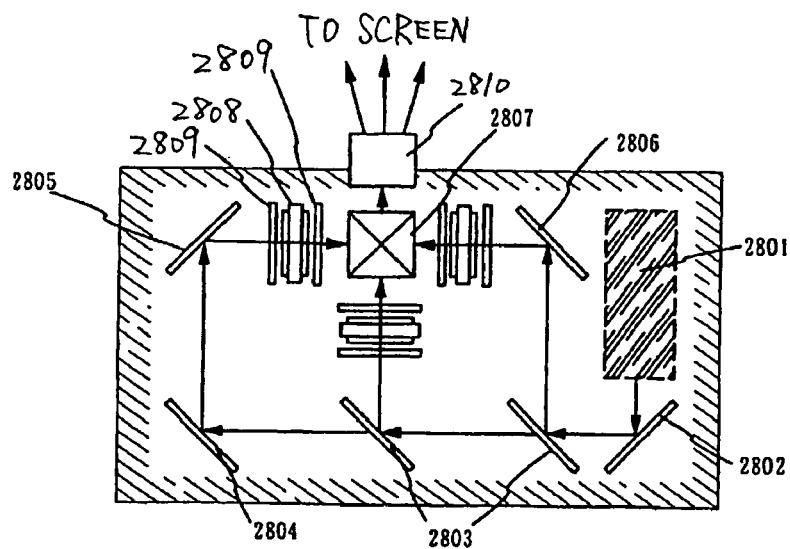
Fig. 18C PROJECTING UNIT (TRIPLE-PLATE TYPE)
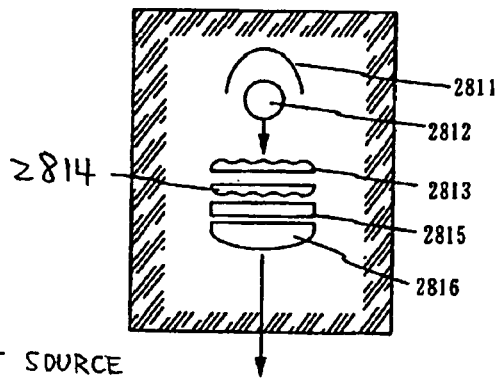
Fig. 18D LIGHT SOURCE OPTICAL SYSTEM

SEMICONDUCTOR DEVICE AND MANUFACTURING METHOD THEREOF

BACKGROUND OF THE INVENTION

The present invention relates to a semiconductor device having a circuit constituted of a thin film transistor (hereinafter, referred to as TFT) and manufacturing method thereof. More particularly, the invention relates, for example, to an electrooptical device exemplified by a liquid crystal display panel and a light-emitting device exemplified by an electroluminescence display device and electronic apparatus on which electrooptical devices as described-above are mounted as component parts thereof.

In this specification, the term "semiconductor device" means every device that functions by using the semiconductor characteristics; i.e., electrooptical devices, light-emitting devices, semiconductor circuits and electronic apparatuses are all included in the semiconductor device.

Recently, a technique, in which a thin film transistor (TFT) is constituted using a semiconductor thin film (approximately several nm-several hundreds nm in thickness) having an insulated surface on a substrate, has attracted attention. The thin film transistor has been widely applied to electronic devices such as IC, electrooptical device and so on; in particular, it is desired to develop the same as a switching element for display device on various apparatuses.

Particularly, an active matrix type liquid crystal display device, which is provided with switching element of TFT to each display pixel disposed on a matrix, has been developed.

As for the active matrix type liquid crystal display device, a development to extend the effective screen area in the pixel section is now under progression. To enlarge the area of the effective screen area, it is necessary to reduce the area occupied by the TFT disposed in the pixel section as small as possible. Further, in order to reduce the manufacturing cost, a development to build a drive circuit on the same substrate along with the pixel section is also under progression. When the drive circuit and the pixel section are formed on the same substrate, compared to the case that the drive circuit is mounted in a manner of TAB, there is a tendency that the area occupied by area other than the pixel area, which is called as frame rim area, become large. It is also requested that, in order to reduce the frame rim area, the size of the circuit constituting the drive circuit should be formed further smaller in size.

Particularly, in an organic light emitting device (OLED), a plurality of TFTs, which are different from each other in function, for one pixel. Further, in the liquid crystal display device also, an attempt to form switching TFT and memory element such as SRAM or the like in a pixel has been made. Furthermore, when the pixel section and the drive circuit are formed on the same substrate, it is requested to miniaturize the same as small as possible. As described above, when a plurality of elements are formed within a limited area, a design, in which the elements are disposed on a plane, or a design, in which the elements are piled up, are conceivable. In the case that the elements are disposed on a plane, since the required area allowed to occupy is limited, when the area is limited, a limitation resides therein. Also, in a design that the elements are piled up, for example, when two TFTs are piled up, the number of steps is increased simply by two times or more resulting in a complication in the steps, an increase of cost, a reduction of the throughput and a reduction of the yield.

As for designs of conventional techniques in which elements are piled up; for example, Japanese Unexamined Patent Application Publication No. 10-93099 and Japanese Unexamined Patent Application Publication No. 10-93100 respectively disclose a structure in which an FET and a TFT are piled up on a semiconductor substrate. Also, in Japanese Unexamined Patent Application Publication No. 11-40772, a structure, in which TFTs are disposed being piled up and interposed by insulating film on a bulk transistor, is disclosed. According to these Publications, in any case, an FET or a bulk transistor is formed using a semiconductor substrate, and a TFT is simply formed thereon.

An object of the invention is, in order to promote the tendency toward the foreseeable further compaction in each display pixel pitch accompanying the tendency of higher precision (increase in pixel number) and miniaturization in electrooptical device exemplified by liquid crystal display device, light-emitting device having OLED and semiconductor device, to form a plurality of elements within a limited area and to integrate the same by compacting the area occupied by the elements.

SUMMARY OF THE INVENTION

The invention is characterized in that a plurality of semiconductor layers (semiconductor films having crystal structure respectively) are disposed on the different layers respectively with insulating films sandwiched therebetween so that a part the respective layers is overlapped with each other, and a plurality of elements, of which functions are different from each other on the basis of the respective semiconductor layers, are formed and integrated to miniaturize the circuit size. The above-mentioned "element" means a thin film transistor (P-channel type TFT, N-channel type TFT), a memory element, a thin film diode, a photoelectric conversion element of silicon PIN junction or a silicon resistance element.

The constitution 1 of the invention disclosed in the specification is:

a semiconductor device which comprises, on an insulated surface thereof, a first element which has a first semiconductor layer formed of a semiconductor film having crystal structure, an insulating film on the first semiconductor layer, and a second element which has a second semiconductor layer formed of a semiconductor film having crystal structure on the insulating film, wherein, between the first semiconductor layer and the second semiconductor layer, the insulating film only is included, a part of the first semiconductor layer is overlapped with a part of the second semiconductor layer with the insulating film sandwiched therebetween.

Typically, a double-layered semiconductor layer (typically, polysilicon film) is disposed on different layers with an insulating film sandwiched therebetween, below the semiconductor layer of the lower layer of the double-layered semiconductor layer, a gate electrode is provided to form an inversed stagger type TFT, while, above the semiconductor layer of the upper layer thereof, a gate electrode is provide to form a top gate type TFT. Further, an impurity element for imparting P-type to the upper semiconductor layer may be added, and the impurity element for imparting N-type to the lower semiconductor layer may be added; thereby an N-channel type TFT and a P-channel type TFT can be formed. By combining these TFTs, a CMOS circuit (inverter circuit, NAND circuit, AND circuit, NOR circuit, OR circuit, shift register circuit, sampling circuit, D/A converter circuit, A/D converter circuit, latch circuit, buffer circuit or the like) can be constituted in an area smaller than conventional area. The term "CMOS circuit" means a circuit that has at least an N-channel type TFT and a P-channel type TFT. Additionally, by combining these CMOS circuits, a memory element such as SRAM, DRAM or the like or other element can be constituted. Accordingly, it is possible to miniaturize the area occupied by a drive circuit having various circuits and elements, and since the area of frame rim become smaller; the entire size becomes more compact.

The constitution 2 of the invention disclosed in the specification is, as shown with a typical example thereof in FIG. 1, a constitution in which a P-channel type TFT is formed on an N-channel type TFT, that is:

a semiconductor device which comprises a CMOS circuit disposed on an insulated surface, wherein an N-channel type TFT having a first semiconductor layer as an active layer, an insulating film on the first semiconductor layer and a P-channel type TFT having a second semiconductor layer as a active layer on the insulating film are connected complementally to each other, between the first semiconductor layer and the second semiconductor layer, the insulating film only is included, above the second semiconductor layer, a gate insulating film of the P-channel type TFT and a gate electrode are include, below the first semiconductor layer, a gate insulating film of the N-channel type TFT and a gate electrode are include, a part of the first semiconductor layer is overlapped with a part of the second semiconductor layer with the insulating film sandwiched therebetween.

Further, when carrying out doping processing of the impurity element for imparting conduction type using the gate electrode of top gate type TFT as a mask in a manner of self-aligning, it is possible to reduce the number of the masks, and it is possible to provide a top gate type TFT and an inversed stagger type TFT that have the same channel length.

The constitution 3 of the invention disclosed in the specification is a constitution, in which an N-channel type TFT is formed on a P-channel type TFT, that is:

a semiconductor device that comprises a CMOS circuit disposed on an insulated surface, wherein an P-channel type TFT having a first semiconductor layer as an active layer, an insulating film on the first semiconductor layer and a N-channel type TFT having a second semiconductor layer as a active layer on the insulating film are connected complementally to each other, between the first semiconductor layer and the second semiconductor layer, the insulating film only is included, over the second semiconductor layer, a gate insulating film of the N-channel type TFT and a gate electrode are include, below the first semiconductor layer, a gate insulating film of the P-channel type TFT and a gate electrode, a part of the first semiconductor layer is overlapped with a part of the second semiconductor layer with the insulating film sandwiched therebetween.

According to the invention, in a light-emitting device having an OLED, it is possible to form a switching TFT and a current controlling TFT in a small area within a pixel. Accordingly, since it is possible to make the area of an effective screen area larger, and further, to make each pixel size smaller, it is possible to provide a high precise light-emitting device.

The constitution 4 of the invention disclosed in the specification is:

a semiconductor device which comprises a OLED disposed on an insulated surface, wherein an N-channel type TFT having a first semiconductor layer as an active layer, an insulating film on the first semiconductor layer and a P-channel type TFT having a second semiconductor layer as a active layer on the insulating film are included, the P-channel type TFT is connected to the OLED, between the first semiconductor layer and the second semiconductor layer, the insulating film only is included, above the second semiconductor layer, a gate insulating film of the P-channel type TFT and a gate electrode are include, below the first semiconductor layer, a gate insulating film of the N-channel type TFT and a gate electrode, a part of the first semiconductor layer is overlapped with a part of the second semiconductor layer with the insulating film sandwiched therebetween.

In this specification, every layer formed between the anode and the cathode of the OLED is defined as "organic light-emitting layer". In particular, the organic light-emitting layer includes a light-emitting layer, a positive hole injection layer, an electron injection layer, a positive hole carrier layer, an electron carrier layer or the like. Basically, the OLED has such a structure that an anode, a light-emitting layer and a cathode are built up in that order. In addition to this structure, there may be such structured that an anode, a positive hole injection layer, a light-emitting layer and a cathode are built up in that order; or, an anode, a positive hole injection layer, a light-emitting layer, an electron carrier layer and a cathode or the like are built up in that order.

The OLED has a layer (hereinafter, referred to as organic light-emitting layer) including an organic compound (organic light-emitting material), from which luminescent (Electroluminescence) can be obtained by applying an electric field thereto, an anode and a cathode. There are two modes of luminescence in organic compound; i.e., light emission (fluorescence) obtained when the same returns from a singlet exciton state to a ground state, and light emission (phosphorescence) obtained when the same returns from a triplet exciton state to a ground state. In the light-emitting device according to the invention, any one or both of the above-described modes of luminescence may be used.

Further, in liquid crystal display device also, owing to the invention, since it is possible that a switching TFT and memory element (SRAM, DRAM or the like) comprised of an inverter circuit are formed in a small area on a pixel, and the effective screen area are made larger, and further, each pixel size is miniaturized, it is possible to provide a high precise liquid crystal display device.

Furthermore, by adding the impurity element for imparting N-type to both of the layers of a double-layered semiconductor, it is possible to form two N-channel type TFTs (top gate type and inversed stagger type).

Still further, as a constitution different from the above-described constitutions 1-4, it is not the case that one gate electrode is provided to one semiconductor layer, but the case that one gate electrode is provided to two semiconductor layers. In that case, below the semiconductor layer of the lower layer, or above the semiconductor layer of the upper layer in the layers of the double-layered semiconductor, the gate electrode is provided. Also, when one gate electrode is provided to two semiconductor layers, and the impurity element for imparting N-type or P-type to the semiconductor layer of two layers, the threshold voltage varies depending on the thickness of the insulating film sandwiched between the layers of the double-layered semiconductor. Also, the impurity element for imparting P-type may be added to the semiconductor layer of the upper layer, while, the impurity element for imparting N-type may be added to the semiconductor layer of the lower layer, thereby it is possible to form N-channel type TFT and P-channel type TFT respectively. Since a common gate electrode is provided, by carrying out doping of the impurity element for imparting conduction type using the gate electrode as a mask, it is possible to form the channel of the same length. By combining these TFTs, it is possible to constitute a CMOS circuit in a smaller area.

The constitution 5 of the invention disclosed in this specification is:

a semiconductor device which comprises a CMOS circuit disposed on an insulated surface, wherein an N-channel type TFT having a first semiconductor layer as an active layer, an insulating film on the first semiconductor layer and a P-channel type TFT having a second semiconductor layer as a active layer on the insulating film are connected complementarily to each other, between the first semiconductor layer and the second semiconductor layer, the insulating film only is included, above the second semiconductor layer, a gate insulating film and a gate electrode are included, the gate electrode of the N-channel type TFT and the P-channel type TFT is the identical, a part of the first semiconductor layer is overlapped with a part of the second semiconductor layer with the insulating film sandwiched therebetween.

According to the above-described constitution 5, in a light-emitting device having an OLED, it is possible to form a switching TFT and a current controlling TFT in a small area on one pixel. Further, according to the above-described constitution 5, in a liquid crystal display device, it is possible to form a memory element (SRAM, DRAM or the like) comprised of a switching TFT and an inverter circuit in a small area of one pixel.

Further, in any one of the above-described constitutions 2-5, the first semiconductor layer and the second semiconductor layer are semiconductor films having crystal structure.

In any one of the above-described constitutions 2-5, it is characterized in that the first semiconductor layer and the second semiconductor layer have at least a channel forming area, a source area and a drain area respectively, the area where a part of the first semiconductor layer is overlapped with a part of the second semiconductor layer with an insulating film sandwiched therebetween is at least a channel forming area, and a source area or a drain area also is overlapped with each other.

In this specification, the area, which is called as channel forming area (also, called as "channel"), is an area including a portion where carriers (electron/hole) flow. For example, in the case of inversed stagger type TFT, a channel is formed adjacent to the boundary between the gate insulating film and the semiconductor film, where is above the gate electrode. The entire area sandwiched between the insulating film covering the semiconductor film including the area adjacent to the boundary of the semiconductor film and the gate insulating film is called as "channel forming area".

Further, in anyone of the above-described constitutions 2-5, it is characterized in that the channel length of the channel forming area in the first semiconductor layer and the channel length of the channel forming area in the second semiconductor layer are the same.

In Japanese Unexamined Patent Application Publication No. 5-257169, a technique in which, in a liquid crystal display device, two TFTs are formed by piling a inversed stagger type TFT and a stagger type TFT; one is formed as an N-channel and the other is formed as a P-channel, is disclosed. However, according to the above-described Publication, although two TFTs are formed, the source and the drain are formed commonly, and two TFTs function as a sole switching element; the same is largely different from the invention. According to the invention, a plurality of elements having different functions respectively is formed. Additionally, according to the above-described Publication, since the TFTs are of amorphous silicon, it is difficult to form a CMOS circuit for the drive circuit, and further, the same are not suitable as TFTs to be connected to the OLED.

As a constitution different from the above-described constitutions 1-5, a TFT may be such constituted that a plurality of channel forming areas are included therein by providing a gate electrode to two semiconductor layers. In this case, connection electrodes for electrically connecting the semiconductor layer of the upper layer and the semiconductor layer of the lower layer are provided. Since a common gate electrode is provided, although it is possible to form the channel length so as to be the same, but since the distance from the gate electrode, the same is different from conventional double gate structure. Owing to this arrangement, it is possible to provide a multi-gate constitution in a small area without disposing a plurality of gate electrodes. It is possible to form, for example, in a liquid crystal display device, a switching TFT having a plurality of channel forming area in a small area on one pixel.

As an example is shown in FIG. 4, the constitution 6 of the invention disclosed in this specification is:

a semiconductor device which comprises a TFT having a plurality of channel forming areas disposed on an insulated surface, wherein the TFT includes a first semiconductor layer and a second semiconductor layer as active layers, the first semiconductor layer and the second semiconductor layer are electrically connected to each other via electrodes, between the first semiconductor layer and the second semiconductor layer, an insulating film only is included, on the second semiconductor layer, a gate insulating film of the TFT, and on the gate insulating film, a gate electrode are included, in the second semiconductor layer, an area where is overlapped with the gate electrode with the gate insulating film sandwiched therebetween is a second channel forming area, in the first semiconductor layer, an area where is overlapped with the gate electrode with the gate insulating film, the second channel forming area and the insulating film sandwiched therebetween is a first channel forming area.

Also, in the above-described constitution 6, by providing a gate electrode to two semiconductor layers, and carrying out doping of impurity element for imparting conduction type on a TFT, which has a plurality of channel forming areas, in a manner of self-aligning using a common gate electrode as a mask, a multi-gate constitution having the same channel length can be provided.

Furthermore, in the above-described constitution 6, when a TFT having a plurality of channel forming areas is formed by providing a gate electrode to two semiconductor layers, it is possible to form a capacitance using an insulating film sandwiched between the two semiconductor layers as a dielectric.

In any one of the above-described constitutions 1-6, it is characterized in that the film thickness of the first semiconductor layer is the same as that of the second semiconductor layer, or thinner than the film thickness of the second semiconductor layer.

Further, in any one of the above-described constitutions 1-6, the film thickness of the insulating film disposed between plurality of semiconductor layers is appropriately selectable within a range of 10 nm-2 μm. Particularly, in the case that a plurality of different elements is formed, by forming the film thickness of the insulating film 200 nm or more, when a plurality of the respective elements, in which each of the semiconductor layers is formed as an active layer, is driven, it is possible to prevent influences among the respective elements.

Furthermore, a several kinds of constitutions may be formed by appropriately combining the above-described constitutions 1-6 on the same substrate.

The manufacturing method of a plurality of semiconductor layers, which is formed on different layers with insulating film sandwiched therebetween, is one of characteristics of the invention, wherein, by means of irradiation processing of laser beam, crystallization of the plurality of semiconductor layers is carried out simultaneously. Accordingly, between the respective semiconductor layers, only the insulating film is built up so that the laser beam is irradiated on every semiconductor layer. In more particular, a laser beam is irradiated on a semiconductor film having amorphous structure on the upper layer to crystallize the same, and further, by allowing a part of the laser beam to pass through a semiconductor film having amorphous structure on the upper layer, and further, through the insulating film, to irradiate the semiconductor film having amorphous structure on the lower layer to crystallize the same, and at the same time, to form a plurality of semiconductor layers, which is comprised of a semiconductor films having crystal structure. And an element or a plurality of elements that has these pluralities of semiconductor layers is formed.

The constitution with respect to the manufacturing method disclose in this specification is:

a manufacturing method of semiconductor device, which comprises:

a first step for forming a first semiconductor film having amorphous structure on an insulated surface, a second step for forming an insulating film on the semiconductor film, a third step for forming a second semiconductor film having amorphous structure on the insulating film, a fourth step for irradiating a laser beam to the first semiconductor film having amorphous structure and the second semiconductor film having amorphous structure to form the first semiconductor film having crystal structure and the second semiconductor film having crystal structure simultaneously.

The laser beam used in the invention is selectable from gas laser such as excimer laser, Ar laser, Kr laser or the like; solid-state laser such as YAG laser, $YVO_4$ laser, YLF laser, $YAlO_3$ laser, glass laser, ruby laser, alexandrite laser, Ti:sapphire laser or the like; and full-solid infrared laser of semiconductor laser excitation. It is desired that the laser is a large output laser having a wavelength range, which passes through a single layer semiconductor and is absorbed by a semiconductor layer. FIG. 6A shows the transmittance with respect to an amorphous silicon film of 55 nm in film thickness; FIG. 6B shows the reflectance thereof. FIG. 7A shows the transmittance with respect to a polysilicon film of 55 nm in film thickness, and FIG. 7B shows the reflectance thereof. In FIG. 6 and FIG. 7, at a wavelength, the sum of the transmittance, the reflectance and the absorptance is 1.

Based on FIG. 6 and FIG. 7, as for the laser beam used in the invention, light having a wavelength range of 400 nm-800 nm.

The mode of laser oscillation is selectable from continuous oscillation and pulse oscillation. Also, the configuration of the laser beam in the irradiation area is selectable from line-like, rectangular-like and ellipse-like in configuration. To obtain a large size crystal by crystallization of a semiconductor film having amorphous structure, it is desired to use a solid-state laser capable of continuous oscillation and to apply second harmonic-fourth harmonic in the basic wave. As for the solid-state laser, a laser using a crystal of YAG, $YVO_4$, YLF, $YAlO_3$ or the like doped with Cr, Nd, Er, Ho, Ce, Co, Ti or Tm is applied to. The basic wave of the laser varies depending on doping material, and laser beam having 1 μm or so in basic wave is obtained. The harmonic with respect to the basic wave can be obtained by using a nonlinear optical element.

When the crystallizing is carried out by irradiating laser beam of continuous oscillation to the semiconductor film, which has amorphous structure, it is possible that the solid-liquid phase boundary is held to allow the crystal growing continuously in the scanning direction of the laser beam.

Since the energy given by the laser of continuous oscillation is large, it is possible to crystallize the double-layered semiconductor layer by one laser irradiation processing. If necessary, the laser irradiation processing may be repeated several times. Also, although the laser beam incident the substrate is reflected at the surface of the substrate, since the laser beam is light having a high directivity and energy density, a damper may be provided to absorb the reflected light in order to prevent the reflected light from irradiating undesired area. According to the invention, it is possible to absorb the reflected light at the surface of the substrate by the double-layered semiconductor, since almost every laser beam can be absorbed by providing a double-layered or more semiconductor layer, particular damper may not be provided. Furthermore, since it is also possible to absorb the reflected light of the semiconductor layer of the lower layer by carrying out the irradiation again to the semiconductor layer of the upper layer, it is possible to irradiate the laser beam to the semiconductor layer effectively. Further, by repeating the reflection between the double-layered semiconductor layers and between the semiconductor layer and the substrate, it is possible to irradiate the laser beam to the semiconductor layer effectively. Still further, when by providing a metal film having a high reflectance below the double-layered semiconductor layer, by repeating the reflection between the double-layered semiconductor layer, and between the semiconductor layer and the metal film, it is also possible to irradiate the laser beam to the semiconductor layer effectively. According to the invention, the laser beam, which has passed a single layer of the semiconductor layer, is used effectively. As described above, it is possible to give energy to the double-layered semiconductor layer effectively by means of a large output laser. Further, it is possible to reduce the damages given on the substrate or the like due to the irradiation of a large output laser.

Further, when the scanning is carried out while irradiating the laser beam selectively, since it is possible to crystallize the double-layered semiconductor layer, it is possible to reduce the total irradiation area resulting in an increased throughput.

Furthermore, when a full-solid infrared laser of semiconductor laser excitation is used, the wavelength (1064 nm) of a full-solid infrared laser beam may be reduced into a half using a green-conversion optical crystal to generate a large output (100 W or more) green laser beam (wavelength 532 nm).

Still further, a laser having a low transmittance with respect to the amorphous silicon film, since almost every laser beam is absorbed by the semiconductor layer of the upper layer, the state of the crystal of the semiconductor layer of the upper layer differs from that of the semiconductor layer of the lower layer.

In the case that a TFT having a semiconductor layer of the upper layer as the active layer may be different in characteristics from a TFT having semiconductor layer of the lower layer as the active layer, the state of the crystal of the semiconductor layer of the upper layer may be different from that of the semiconductor layer of the lower layer. For example, if an enough ON/OFF ratio is obtained, and OFF-current value is at least, $1 \times 10^{-6}$ (A) or less, the TFT used in CMOS circuit is usable. Further, in the case that the characteristics of one TFT is particularly important, the energy of the laser beam, which is absorbed by the semiconductor film having first amorphous structure, may be different from the energy of the laser beam, which is absorbed by the semiconductor film having second amorphous structure.

When it is desired that the characteristics are the same between the TFT having the semiconductor layer of the upper layer as the active layer and the TFT having the semiconductor layer of the lower layer as the active layer, in order to obtain the semiconductor layers having substantially same crystallinity, it is preferred to adapt so that the energies absorbed as the total become roughly the same to each other by altering the film thickness of the double-layered semiconductor layer. For example, in two semiconductor layers, the upper layer may have a thinner film thickness; while, the lower layer may have a thicker film thickness. When the laser that passes through the upper layer is a half; i.e., the absorptance with respect to the semiconductor layer of the upper layer is 50%, it may be adapted so that the film thickness of the lower layer is approximately twice as the film thickness of the upper layer.

Further, in order to obtain the semiconductor layers having substantially the same crystallinity, the material of the double-layered semiconductor layer may be changed.

When a wavelength of the laser beam, which is hardly absorbed by the semiconductor film having amorphous structure, is selected, it is possible to adapt the state of crystal of two semiconductor layers to be the same. For example, a continuous oscillation laser using the second harmonic (532 nm) of an $YVO_4$ laser is selected, since the transmittance with respect to the amorphous silicon film and the polysilicon film is high, it is possible to obtain the semiconductor layers having substantially the same crystallinity each other. Further, since the double-layered semiconductor layers, which has irradiated with the laser beam, become heat insulating layers each other, and since the period of cooling time also becomes substantially the same, it is possible to obtain semiconductor layers that have substantially the same crystal state. Further, since the double-layered semiconductor layers become heat insulating layers each other, and the period of cooling time is elongated, it is possible to generate a large size crystal. In this case, to the semiconductor layer of the lower layer, both of the heat radiating energy from the semiconductor layer of the upper layer and the energy from the laser beam (laser beam, which has passed through the insulating film and the semiconductor layer of the upper layer) are given; to the semiconductor layer of the upper layer, the energy from the laser beam and the energy of the laser beam, which has been reflected by the semiconductor layer of the lower layer, are given.

Furthermore, in order to adapt so that the energy of the laser beam, which is absorbed by the first semiconductor film having amorphous structure, and the energy of the laser beam, which is absorbed by the second semiconductor film having amorphous structure, are the same, the energy density given to the upper layer may be differed from the energy density given to the lower layer. By focusing the laser beam so that the irradiation area of the upper layer is larger than the irradiation area of the lower layer, the energy density may be adjusted by adjusting the focus position or film thickness of the insulating film. When the laser, which passes through the upper layer, is a half; i.e., when the transmittance is 50%, it is adjusted so that the area of the lower layer to be irradiated is a half of that of the upper layer.

Although an example, in which the semiconductor layer is a double-layered structure, has been described above, by forming semiconductor layers of triple layers or more on the different layers with insulating films sandwiched therebetween, the integration may be further increased. Further, when a plurality of TFTs of different kinds is formed on the same substrate, in an area, a double-layered semiconductor layer with insulating film sandwiched therebetween may be formed, and in another area, a single layered semiconductor layer may be formed and irradiated with laser beam. In particular, in a drive circuit, a double-layered semiconductor layer is formed, and in the pixel section, a single layered semiconductor is formed and by irradiating with the above-described laser beam to form TFTs respectively, a CMOS circuit, in which the occupied area is compacted by forming a double-layered semiconductor in the drive circuit, is formed, while, in the pixel section, a TFT having a single-layered semiconductor as the active layer is formed.

Although an example has been described here, in which the semiconductor layer of the upper layer is irradiated directly with the laser beam, the laser beam may be irradiate after the insulating film has been covered.

Conventionally, since it was difficult to irradiate a large output laser stably, it was impossible to obtain such a constitution as the invention. Although, it is possible to form the constitution as the invention in a manner of solid-state growing, in the case of double-layered semiconductor layer, since the crystallizing processes increase simply twice and the time required for crystallizing processing becomes enormously, it is not suitable for mass production. Even when it is try to obtain the constitution as the invention, since the number of steps is increased largely and the throughput is extremely decreased, the steps are not suitable for mass production.

According to the invention, although the number of steps is increased in the patterning step of the first semiconductor layer and the insulating film forming step for covering the first semiconductor layer, the number of steps required for the crystallization is the same, without increasing the same, as the case that the number of the semiconductor layer is one.

In the Japanese Patent Application Laid-Open No. 2000-505241, discloses an art that, using a heat insulating layer as the lower layer, a semiconductor layer is formed being interposed with an insulating film on the heat insulating layer, and a laser beam (wavelength 308 nm) is irradiated to obtain a large size crystal. However, according to the Publication, the laser is not a laser of large output; further there is no description that the heat insulating layer is used as the active layer of the TFT. Accordingly, from the technique disclosed in the above-described Publication, the invention is not conceivable. According to the technique disclosed in the Publication, a laser beam of wavelength range (308 nm), which does not pass through the amorphous silicon, and the heat insulating layer of the lower layer is heated by only the heat radiated from the semiconductor layer of the upper layer. Consequently, according to the technique disclosed in the above-described Publication, the heat insulating layer of the lower layer is hardly crystallized.

Another constitution with respect to the manufacturing method according to the invention is:
a manufacturing method of semiconductor device, which comprises:

a first step for forming a first semiconductor film having amorphous structure on an insulated surface, a second step for forming an first insulating film on the semiconductor film, a third step for forming a second semiconductor film having amorphous structure on the first insulating film, a fourth step for irradiating a laser beam to the second semiconductor film having amorphous structure by allowing the same to pass through the first semiconductor film having amorphous structure and the first insulating film to form the first semiconductor film having crystal structure and the second semiconductor film having crystal structure simultaneously, a fifth step for forming a second insulating film on the second semiconductor film having crystal structure, a sixth step for forming a gate electrode on the second insulating film, a seventh step for adding an impurity element for imparting N-type or P-type to the first semiconductor film having crystal structure or the second semiconductor film having crystal structure using the gate electrode as a mask.

Furthermore, another constitution with respect to the manufacturing method according to the invention is:

a manufacturing method of semiconductor device, which comprises:

a first step for forming a first gate electrode on an insulated surface, a second step for forming a first insulating film for covering the first gate electrode, a third step for forming a first semiconductor film having amorphous structure on the first insulating film, a fourth step for forming a second insulating film on the semiconductor film, a fifth step for forming a second semiconductor film having amorphous structure on the second insulating film, a sixth step for irradiating a laser beam to the second semiconductor film having amorphous structure by allowing the same to pass through the first semiconductor film having amorphous structure and the second insulating film to form the first semiconductor film having crystal structure and the second semiconductor film having crystal structure simultaneously, a seventh step for forming a third insulating film on the second semiconductor film having crystal structure, an eighth step for forming a second gate electrode on the third insulating film, a ninth step for adding an impurity element for imparting N-type or P-type to the first semiconductor film having crystal structure or the second semiconductor film having crystal structure using the second gate electrode as a mask.

Furthermore, in the above-described constitution, it is characterized in that the first gate electrode is the gate electrode of the TFT in which first semiconductor film having crystal structure is the active layer, and the second gate electrode is the gate electrode of the TFT in which the second semiconductor film having crystal structure is the active layer.

The invention is applicable not only to the crystallization of a semiconductor film having amorphous structure but also to the annealing processing (typically, heat treatment such as activation processing or the like), which uses the laser beam. Furthermore, still another constitution with respect to the manufacturing method according to the invention is a manufacturing method of semiconductor device, which comprises the steps of irradiating a laser beam to a first semiconductor film having amorphous structure or crystal structure disposed on an insulated surface, an insulating film on the semiconductor film and a second semiconductor film having amorphous structure or crystal structure on the insulating film; and annealing the first semiconductor film and the second semiconductor film simultaneously.

To obtain the constitutions described in the above descriptions of constitutions 1-6, the method thereof is not limited to the above-described method in which two layers are crystallized simultaneously by means of a laser beam. It is possible to manufacture the constitutions using a method other than the above-described manufacturing methods. However, if a method other than the above-described manufacturing methods is used, the number of steps will be increased and the period of processing time will be elongated. As for the methods other than the above-described manufacturing methods, in which crystallizations are carried out simultaneously, for example, solid-phase growing method may be used; a method in which the crystallization is carried out in a manner of heat treatment while adding a metal element for accelerating the crystallization, may used; or the irradiation may be carried out simultaneously using light from a laser beam or a lamp light source. In the case that the crystallization is carried out by irradiating laser beam from the front-face side and the rear-face side, the wavelength range of the laser beam is not particularly specified. Or, the crystallization may not be carried out simultaneously, but one semiconductor layer may be crystallized first, and then, the other layer may be crystallized.

BRIEF DESCRIPTION OF THE DRAWINGS

FIGS. 1A to 1D3 are illustrations showing Embodiment 1 (CMOS circuit);

FIGS. 4A to 4D3 are illustrations showing Embodiment 3 (LCD);

FIGS. 6A to 6B are graphs showing relationships between wavelength and transmittance and reflectance of amorphous silicon;

FIGS. 7A to 7B are graphs showing relationships between wavelength and transmittance and reflectance of polysilicon;

FIGS. 9A to 9B are diagrams showing equivalent circuits (Embodiment 1);

FIGS. 10A to 10B are a top view and a sectional view of an EL module;

FIGS. 13A to 13D3 are illustrations showing Embodiment 4;

FIGS. 14A to 14C are illustrations showing Embodiment 4;

FIGS. 15A to 15B are illustrations showing Embodiment 5;

FIGS. 17A to 17F are illustrations showing examples of electronic apparatus;

FIGS. 18A to 18D are illustrations showing examples of electronic apparatus.

PREFERRED EMBODIMENTS OF THE INVENTION

Figure 2A:
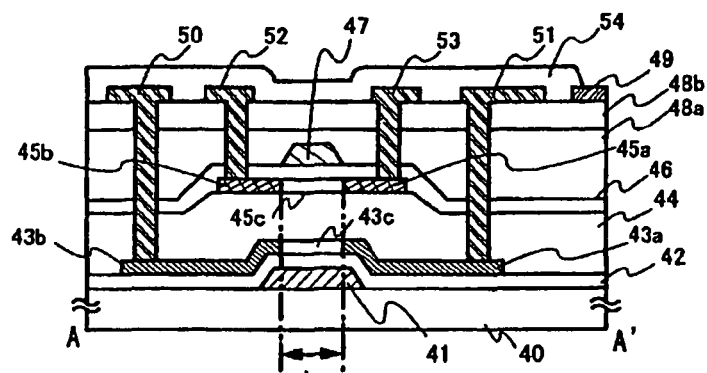
FIGS. 2A to 2C are illustrations showing Embodiment 2 (OLED)

Hereinafter, Embodiments of the invention will be described.

Embodiment 1

FIG. 1 briefly show a typical semiconductor device to which the invention is applied and a manufacturing method thereof. In this case, a description will be made while taking an inverter circuit as an example of CMOS circuit.

In FIG. 1A, reference numeral 10 denotes a substrate having insulated surface; reference numeral 11 denotes a first electrode; reference numerals 12a, 12b denote first insulating films; reference numeral 13 denotes a first semiconductor layer; reference numeral 14 denotes a second insulating film; and reference numeral 15 denotes a second semiconductor film.

In FIG. 1A, as for the substrate 10, a glass substrate, a quartz substrate, a ceramic substrate or a plastic substrate is applicable. As for the plastic substrate, since the heat resistance thereof is low, it is necessary to set the heat-treating temperature to a relatively low level, for example, to a temperature lower than 300° C.

First of all, as shown in FIG. 1A, the first electrode 11 is formed on the substrate 10. The first electrode 11 is a portion, which finally becomes a gate electrode of a TFT at one side, and is able to be formed by carrying out patterning using a first mask after forming a single layer or a laminated layer of a first conductive film. As for the material of the first conductive film, an element selected from Ta, W, Ti, Mo, Al and Cu, or an alloy material or a compound material comprised of the foregoing elements as major components, is used. Also, as for the conductive film, a semiconductor film, which is typically exemplified by a polycrystalline silicon film doped with an impurity element such as phosphorous or the like, or an AgPdCu alloy may be used. Further, although it is not illustrated here, but before forming the first electrode 11, an insulating film comprised of silicon as the major component may be formed as a base film.

Next, the first insulating film 12a, which covers the first electrode 11 and becomes the lower layer, is formed. Further, the first insulating film 12b, which is flat and becomes the upper layer, is formed. In this case, although the first insulating film is exemplified as a double-layered structure, it may be formed into a single layered structure of an insulating film comprised of silicon as the major component, or into a structure laminated more than two layers. In this case, after forming the first silicon oxide film, which becomes the lower layer and laminating and forming the second silicon oxide film, which become the upper layer, by means of plasma CVD, a known flattening processing; for example, a polishing processing, which is named as Chemical-Mechanical Polishing (hereinafter, referred to as CMP) is carried out. As another flattening processing, etch back method, in which, after forming a coating film (resist film or the like), etching or the like is carried out to flatten the same, is also applicable. As the first insulating film 12b, which becomes the upper layer, a flat silicon oxide film may be formed by means of application. These first insulating films 12a, 12b finally become a gate insulating film of the TFT at one side. Total film thickness of the first insulating films 12a, 12b is appropriately selectable within a range of 50 nm-200 nm.

Next, a first semiconductor film, which has a film thickness within a range of 25-200 nm and an amorphous structure, is formed, and patterning is carried out using a second mask to form the first semiconductor layer 13. Also, although the material of the first semiconductor film is not particularly limited to, but it is preferred that, using silicon or silicon germanium ($Si_xGe_{1-x}$(X=0.0001-0.02)) alloy or the like, the first semiconductor film can be formed by a known means (sputtering, LPCVD or plasma CVD or the like). Further, as for plasma enhanced CVD system, any of single wafer processing equipment and batch processing system is applicable.

In this specification, a term "layer" means a state after a configuration has been formed by means of patterning or the like; and a term "film" means a state after a film has been formed.

Next, the second insulating film 14, which covers the first semiconductor layer 13, is formed. The second insulating film 14 may be formed into a structure of a single layered film or being laminated more than two layers of an insulating film comprised of silicon as the major component. The film thickness of the second insulating film 14 is appropriately selectable within the range of 10 nm-2 μm. However, when the finally manufactured two TFTs; i.e., CMOS circuits are driven, since the both exercise an influence on each other depending on the film thickness and the material of the second insulating film 14, it is preferred that the film thickness is more than the 200 nm.

Next, the second semiconductor film 15, which has a film thickness within the range of 25-200 nm and an amorphous structure, is formed on the second insulating film 14. Also, although the material of the second semiconductor film is not particularly limited to, it is preferred to form the second semiconductor film using silicon or silicon germanium ($Si_xGe_{1-x}$ (X=0.0001-0.02)) alloy or the like by means of a known means (sputtering, LPCVD, plasma CVD or the like). Further, the second semiconductor film may be different from the first semiconductor film in the material or the film thickness.

Next, irradiation of laser beam is carried out to crystallize both of the above-described two layer semiconductors (FIG. 1A). In this case, since a laser beam that passes through the second semiconductor film 15 is irradiated to the first semiconductor layer 13, when the laser beam has at least wavelength and energy capable of passing through the second semiconductor film and crystallizing the two layer semiconductors, the laser beam is not particularly limited to. When crystallizing semiconductor films having amorphous structure, to obtain a large size crystal, it is preferred to use a solid-state laser capable of continuous oscillation, and to apply the second harmonic-fourth harmonic of the basic wave. The second harmonic (532 nm) and the third harmonic (355 nm) of the Nd:YVO$_4$ laser (basic wave 1064 nm) is applied to. A laser beam radiated from the YVO$_4$ laser of continuous oscillation of 10 W output is converted by a nonlinear optical element to obtain these harmonics. Also, a method, in which an YVO$_4$ crystal and a nonlinear optical element are set in a resonator and a harmonic is irradiated, is available. Preferably, the laser beam is reformed into a shape of rectangular or elliptical at the irradiated surface by the optical system and is irradiated onto the object to be processed. Energy density at this time is required to be 0.01-100 MW/cm$^2$ or so (preferably, 0.1-10 MW/cm$^2$). And the semiconductor film is irradiated while being made a relative movement with respect to the laser beam at a speed of 0.5-2000 cm/s or so. It is preferred to irradiate the beam at an angle with respect to the surface of the semiconductor film so as not allow the incident light and the reflected light at the rear face of the substrate to interfere each other. In this case, since the reflectance changes remarkably with respect to the changes of the incident angle of the laser beam, it is preferred to adopt the angle of the laser beam so that the changes of the reflectance is within 5%.

Also, when a laser of continuous oscillation is used, it is preferred to scan the area to irradiated by the laser beam while moving the same in the direction of the channel length (in the direction of movement of the carrier) of the TFT, which is finally formed.

Further, the energy owing to the irradiation of the above-described laser beam, which has been absorbed in the second semiconductor film, changes into heat and is transmitted to the first semiconductor layer. Accordingly, total energy absorbed by the respective semiconductor layers is made to be even, and the cooling period between the layers becomes substantially the same. Owing to being made to be even, since the heat of the melted silicon is maintained each other resulting in an elongated cooling period, it is possible to allow a large size crystal to be generated. That is to say, it is possible to obtain a semiconductor film that has the crystallinity better than the case that a single-layered amorphous silicon film is crystallized by means of a laser beam of continuous oscillation. Furthermore, as for the total energy being made to be even, a better effect is obtained when the film thickness of the second insulating film, which is sandwiched between the layers, is thinner. In order to obtain the effect, according to the invention, two semiconductor layers are disposed with only the second insulating film being sandwiched between them.

Furthermore, owing to the above-described irradiation of the laser beam, the laser beam reflected to the first semiconductor layer is irradiated again to the second semiconductor film and absorbed thereby. And the reflection is repeated between the first semiconductor layer and the second semiconductor film and absorbed by the respective semiconductors. Also, in the case that a conductive layer having reflectivity is provided below the first semiconductor layer, it is possible that the laser beam due to the reflection from the conductive layer is absorbed. Further, it is also possible that the laser beam due to the reflection from the substrate and the stage is absorbed.

Still further, although the laser beam may be focused to either of the semiconductors, when the beam is focused to the first semiconductor layer of the lower layer, although it depends on the film thickness of the second insulating film, the energy density irradiated to the first semiconductor layer can be adapted to be larger than the energy density irradiated to the second semiconductor film. Further, the film thickness of the first semiconductor layer and the film thickness of the second semiconductor film may be adjusted in accordance with the transmittance of the laser beam with respect to the second semiconductor film so that the absorbed amounts of the total energy are the same.

Still furthermore, the above-described laser beam may be irradiated after adding a metal element exemplified by nickel, which accelerates the crystallization of the silicon, to the second semiconductor film having amorphous structure. Since the conditional margin for the laser beam is widened by adding the nickel, it becomes easy to form semiconductor film having a preferable crystal structure. Also, when the crystallization is carried out using a metal element, it is preferred to carry out gettering to remove the added metal element in the following step from the semiconductor film.

Thus, after forming the first semiconductor layer 16 having crystal structure and the second semiconductor film having crystal structure, patterning is carried out using a third mask to form a second semiconductor layer 17. In this case, in order to establish the contact with wiring later, the size of the first semiconductor layer 16 is made different from that of the second semiconductor layer 17. However, it is not limited to the configuration of the respective semiconductor layers here, but at least it is required that the finally formed channel forming areas overlap with each other with the second insulating film 14 being sandwiched between them. Further, in this case, although the patterning is carried out after carrying out the crystallization by means of the laser beam, the patterning may be carried out before carrying out the crystallization by means of the laser beam.

When it is necessary to control the threshold, channel doping for controlling the threshold may be carried out after the first semiconductor layer 16 having crystal structure and the second semiconductor film having crystal structure have been formed.

Next, a third insulating film 18, which covers the second semiconductor layer 17, is formed. The third insulating film 18 may be formed into single layered structure or a structure being laminated more than two layers of an insulating film comprised of silicon as the major component. Also, the third insulating film comprised of oxidized film may be formed only on the second semiconductor layer by means of thermal oxidation. The third insulating film 18 becomes finally another gate insulating film. The film thickness of the third insulating film 18 is preferably selectable within the range of 50 nm-200 nm. In this case, although the third insulating film 18 is formed after carrying out the crystallization, the crystallization may be carried out by irradiating the above-described laser beam allowing passing through the third insulating film after the third insulating film has been formed.

Next, a contact hole, which reaches the first electrode 11, is formed using a fourth mask. Then, after forming the second conductive film, a second electrode 19, which is electrically connected with the first electrode 11, is formed using a fifth mask (FIG. 1B). The second conductive film is formed with a material that is an element selected from Ta, W, Ti, Mo, Al and Cu, or, an alloy material or a compound material comprised of the above-described element as the major component. As for the conductive film, a semiconductor film exemplified by polycrystalline silicon film, which is doped with an impurity element such as phosphorous or the like, or an AgPdCu alloy may be used. The second electrode 19 finally becomes another gate electrode.

Next, an impurity element, which imparts the semiconductor N-type or P-type, is added using the second electrode 19 as a mask (FIG. 1C). In this case, N-type impurity areas 20, 21 are formed in a manner of self-aligning by adding phosphorous to the first semiconductor layer 16 and allowing the same to pass through the third insulating film 18, the second semiconductor layer 17 and the second insulating film 14 by means of ion doping. Then, P-type impurity areas 22, 23 are formed in a manner of self-aligning by adding boron to the second semiconductor layer 17 by means of ion doping and allowing the same to pass the third insulating film 18. By appropriately setting the doping conditions respectively in accordance with the depth from the surface, it is possible to add a desired impurity density respectively to the first semiconductor layer and the second semiconductor layer disposed in the different depth respectively. Since the boron is small in atom size and is hard to activate after the addition, the second semiconductor layer is made to be amorphous by giving doping damage by means of doping of phosphorous. The order of the above-described doping is not particularly limited to. Also, in place of the ion doping, ion implantation after mass separation may be applied to. As for the doping, since the added amount of the dopant varies depending on the depth direction, in the area where actual depth from the surface differs due to the second semiconductor layer, which lies above the same; i.e., in the area adjacent to the channel forming area 28 in the impurity areas 20, 21, the dopant is added at a low density to form an LDD area (not shown in the Figures).

Further, after carrying out the first doping on the second semiconductor layer, the third insulating film 18 may be removed selectively excluding only the portion where overlaps with the second electrode 19 by means of dry etching to expose the second semiconductor layer, and the addition to the first semiconductor layer may be carried out by carrying out the second doping. Further, in the case that the selective ratio between the second semiconductor layer and the second insulating film is high after the doping has been carried out, the first semiconductor layer may be exposed by means of dry etching excluding only the portion where overlaps with the second semiconductor layer in the second insulating film. When the first semiconductor layer and the second semiconductor layer have been exposed, it makes the following step to form a contact hole, which reaches the first semiconductor layer, easy.

Next, in order to activate the added impurity element, heat treatment and strong light irradiation from a lamp light source or laser beam irradiation are carried out. Also, two layers may be activated simultaneously using a laser beam, which passes through the second semiconductor layer. When second harmonic-fourth harmonic are used for the activation using a solid-state laser (YAG laser, YVO$_4$ laser, YLF laser, or full-solid infrared laser of semiconductor laser excitation, or the like), which is capable of continuous oscillation, approximately 0.01-100 MW/cm$^2$ (preferably, 0.01-10 MW/cm$^2$) is required. Further, the irradiation is carried out at a speed of approximately 0.5-2000 cm/s while shifting the semiconductor film with respect to the laser beam. Furthermore, the irradiation may be carried out by means of a strong light or laser beam from the both sides; i.e., from the rear-face side and the front-face side thereof. When the activation is made by irradiating the laser beam from the front-face side and the rear-face side, the wavelength range of the laser beam is not particularly limited to. Along with the activation, the plasma damage to the insulating film, which becomes the gate insulating film and the plasma damage to the boundary between the insulating film and the semiconductor layer, which becomes gate-insulating film, can be restored.

Next, an interlayer insulating film 24 is formed and is subjected to hydride treatment. And then, contact holes, which reach the impurity areas 20-23, are formed using a sixth mask. When the enough selective ratio is provided, each contact hole may be formed simultaneously; may be formed separately; or may be formed step-by-step. The contact holes, which reach the impurity areas 22, 23 of the second semiconductor layer 17, are formed in the area inner than the area where the contact holes, which reach the impurity areas 20, 21 of the first semiconductor layer 16. Then, a third conductive film is formed, and then wirings 25-27, which electrically connect to the respective impurity areas 20-23, are formed using a seventh mask (FIG. 1D1).

By performing the above-described processes, a P-channel type TFT 30 of top gate structure, which has the second electrode 19 as the gate electrode, the third insulating film 18 as the gate insulating film, and the source area 23, the drain area 22 and a channel forming area 29 sandwiched between these areas as the active layer, the source wiring 27 for connecting to the source area 23, and the drain wiring 25 for connecting to the drain area 23 (22), is completed. Additionally, an N-channel type TFT of inversed stagger structure, which has the first electrode 11 as the gate electrode, the source area 21, the drain area 20 and the channel forming area 28 sandwiched between these areas as the active layer, is completed.

Also, if necessary, a passivation film (protection film) comprised of nitride film may be formed by covering the TFT appropriately.

Further, in the manufacturing process according to the invention, CMOS circuit can be manufactured using seven masks. Conventionally, when manufacturing CMOS circuits aligned in parallel to each other, six masks are required; i.e., a mask for patterning semiconductor layer, a mask for patterning gate electrode, a doping mask of impurity element for imparting N-type, a doping mask of impurity element for imparting P-type, a mask for patterning contact holes and a mask for patterning wirings. According to the invention, by adding only one mask, required area of the CMOS circuit can be reduced largely.

FIG. 1D2 shows an example of the top view. A sectional view, which is taken along the chain line A-A' in FIG. 1D2, correspond to FIG. 1D1. In the top view, although the island-like second electrode 19 is connected to the first electrode 11, which is branched from a wiring, the invention is not limited to the top view. For example, the first electrode may be formed island-like and the second electrode may be connected to a wiring. Also, it is illustrated that the width of the first electrode 11 is the same as that of the second electrode 19. However, depending on the patterning accuracy, the actual width of the first electrode 11 differs from the width of the second electrode 19. For example, when the width of the first electrode is formed larger than that of the second electrode, it is structured so that apart of the first electrode 11, which is the gate electrode and the impurity areas 20, 21, which are the source area or drain area, are overlapped with each other sandwiching the first insulating films 12a, 12b. Also, when the width of the first electrode is formed smaller than that of the second electrode, an offset area (comprised of the same material as the channel forming area) is formed between the channel forming area and the source area (or drain area).

As shown in FIG. 1D2, the second electrode 19 is connected to the first electrode 11. The first electrode 11 is the gate electrode of the N-channel type TFT that comprises the source area 21, the drain area 20 and the channel forming area 28 sandwiched between these areas as the active layer. Further, although the size of the first semiconductor layer and that of the second semiconductor layer differ from each other in order to establish the contact therebetween, the configuration is not particularly limited thereto. Furthermore, the channel forming area 28 of the N-channel type TFT is the same as the channel length L of the channel forming area 29 in the P-channel type TFT. On the other hand, in this case, in order to illustrate the positional relationship so as to be understandable, although it is shown that the N-channel type TFT is slightly larger in the channel width W, the same may be the same as that of the P-channel type TFT. The N-channel type TFT is the inversed stagger type TFT and the gate insulating film is the first insulating films 12a, 12b. Since the drain area 20 is electrically connected to the drain wiring 25, it is possible to form CMOS circuit by combining complementarily with the above-described P-channel type TFT 30. FIG. 1D3 shows an example of an equivalent circuit diagram in a CMOS circuit.

In the case that the CMOS circuit is driven, a random minus voltage (a minus voltage larger than the threshold of the P-channel type TFT 30) is applied to the gate wiring (including first electrode 11 and the second electrode 19), since the P-channel type TFT 30 becomes ON-state and the N-channel type TFT becomes OFF-state, the voltage Vcc of the power supply voltage line, which is connected to the source wiring 27, is given to the drain wiring 25. On the other hand, when a random plus voltage (a plus voltage larger than the threshold of the N-channel type TFT) is applied to the gate wiring, since the N-channel type TFT becomes ON-state and the P-channel type TFT 30 becomes OFF-state, an electric potential same as the GND, which is connected to the source wiring, (or fixed potential) is given to the drain wiring 25.

A simulation was carried out using the same structure as that shown in FIG. 1. The conditions of the simulation are as described below: the film thickness in the first insulating films 12a, 12b and the third insulating film 18 is 110 nm; the channel size (L/W) is 7 μm/8 μm; the film thickness in the first semiconductor layer 16 and the second semiconductor layer 17 is 50 nm; the carrier (B: boron) density in the source area or the drain area of the P-channel type TFT 30 is $1 \times 10^{20}$ atoms/cm$^3$ and the carrier (B: boron) density in the channel forming area 29 is $2 \times 10^{16}$ atoms/cm$^3$; the carrier (P: boron) density in the source area or drain area of the N-channel type TFT is $1 \times 10^{20}$ atoms/cm$^3$ and the carrier (B: boron) density in the channel forming area 28 is $2 \times 10^{16}$ atoms/cm$^3$. Further, it is assumed that the film quality of the first semiconductor layer 16 and that of the second semiconductor layer 17 are the same.

When a voltage of −10V was applied to the second electrode 19 that was the gate electrode (in the case that the N-channel type TFT was in the OFF-state), without depending on the film thickness (50 nm-200 nm) of the second insulating film 14, the Vth (threshold) of the P-channel type TFT 30 showed little changes and fell within the range of −2.44V--2.47V. As for the S-value (sud-threshold coefficient), when the film thickness of the second insulating film 14 was 50 nm, the value was 0.34V/dec; when the same was 100 nm, the value was 0.30V/dec; and the same was 200 nm, the value was 0.27V/dec. Since the larger film thickness of the second insulating film 14 resulted in the better value, it is preferred that the film thickness of the second insulating film 14 is 200 nm or more.

Also, when a voltage of 10V was applied to the second electrode 19 that was the gate electrode (when the P-channel type TFT is in the OFF-state), without depending on the film thickness (50 nm-200 nm) of the second insulating film 14, the Vth (threshold) of the N-channel type TFT 30 showed little changes and fell within the range of 1.58V-1.66V. As for the S-value, when the film thickness of the second insulating film 14 was 50 nm, the value was 0.32V/dec; when the same was 100 nm, the value was 0.30V/dec; and when the same was 200 nm, the value was 0.28V/dec. Since the larger film thickness of the second insulating film 14 resulted in the better value, it is preferred that the film thickness of the second insulating film 14 is 200 nm or more.

With the purpose of comparison, it is assumed that the respective characteristic values of a generally structured P-channel type TFT, in which the gate insulating film is 110 nm; the semiconductor layer is 50 nm; the carrier (B: boron) density in the source area or drain area is $1 \times 10^{20}$ atoms/cm$^3$, and the carrier (B: boron) density in the channel forming area is $2 \times 10^{16}$ atoms/cm$^3$, are: threshold=−2.09V; the S-value is 0.25V/dec. Also, the respective characteristic values of the generally structured N-channel type TFT, in which the carrier (P: phosphorous) density in the source area or drain area is $1 \times 10^{20}$ atoms/cm$^3$, and the carrier (B: boron) density in the channel forming area is $2 \times 10^{16}$ atoms/cm$^3$, are: threshold=1.31V; S-value is 0.26V/dec.

Furthermore, in the ON-current value and the OFF-current value, since there are little differences, it is possible to drive the circuit as the CMOS circuit with no problem. However, in the above-described simulation, it is assumed that the semiconductor layer of the generally structured TFT and the semiconductor layer of the TFT according to the invention have the same film quality. According to the invention, in the case that the laser beam is irradiated to fuse the double-layered semiconductor layers, since the absorbed heat is maintained each other and the period of cooling time of the fused silicon become longer than the case that a single-layered semiconductor layer is fused, it is possible to obtain a semiconductor film that has an preferable crystallinity.

According to Embodiment 1, an example, in which an impurity element for imparting N-type is add to the first semiconductor layer 16, and an impurity element for imparting P-type is added to the second semiconductor layer 17, is given. However, the impurity element for imparting P-type may be added to the first semiconductor layer 16, and the impurity element for imparting N-type may be added to the second semiconductor layer 17.

Further, according to Embodiment 1, an example, in which, after a film having amorphous structure has been formed as the first semiconductor layer, the second insulating film has been formed, and then the second semiconductor film having amorphous structure has been formed, semiconductor layer having double-layered crystal structure is obtained by crystallizing by means of the above-described laser beam, is given. However, the semiconductor layer having the double-layered crystal structure may be obtained in such manner that, after forming the first semiconductor layer by forming a film having crystal structure by means of LPCVD or the like, carrying out patterning, forming the second insulating film, and them forming the second semiconductor film having amorphous structure, the second semiconductor film is crystallized by means of the above-described laser beam and at the same time the first semiconductor layer is annealed.

Further, the invention is not limited to the TFT structure shown in FIG. 1D1. If necessary, it may be such structured that a low density drain (LDD: Lightly Doped Drain) having LDD area between the channel forming area and the drain area (or source area) is formed using a mask. In this structure, an area where is added with impurity element at a low density is disposed between the channel forming area and the source area or drain area formed by adding an impurity element at a high density, and this area is defined as LDD area.

Further, the TFT shown in FIG. 1D1 is a single gate structure. However, it is not limited thereto, but a double gate structure, which has two channel forming areas, may be formed by disposing two gate electrodes flatly in parallel, or a multi-gate structure, which has a plurality more than three of channel forming areas, may be formed.

According to the invention, it is possible to largely reduce the area occupied by the CMOS circuit. Accordingly, it is made possible to miniaturize the drive circuit including the CMOS circuit.

Embodiment 2

Hereinafter, referring to FIG. 2 and FIG. 3, a light-emitting device having a typical OLED, in which the invention is applied to, will be described. In this case, a light-emitting device, in which one pixel has two TFTs (first TFT 55, second TFT 56), will be described as an example.

In the sectional view shown in FIG. 2A, reference numeral 40 denotes a substrate; 41 denotes a first electrode (gate wiring); 42 denotes a first insulating film, 43a and 43b denote a source area or drain area, respectively; 43C denotes a channel forming area; 44 denotes a second insulating film; 45a denotes a source area; 45b denotes a drain area; 45c denotes a channel forming area; 46 denotes a third insulating film; 47 denotes a second electrode; 48a and 48b denote a fourth insulating film respectively; 49 denotes a cathode or anode; 50 denotes a source wiring; 51 denotes a connection electrode, 52 denotes a power supply wiring; 53 denotes a connecting electrode; and 54 denotes a bank.

As for the substrate 40, a glass substrate, a quartz substrate, a ceramic substrate, a plastic substrate or the like is applicable to. Also, the first electrode 41, the second electrode 47, the source wiring 50, the connecting electrodes 51, 53, and the power supply wiring 52 are formed into a single layer of an element selected from Ta, W, Ti, Mo, Al and Cu; or, of an alloy material or compound material comprised of the above-described elements as the major components; or, into a laminated-layer thereof. Further, these electrode and wiring, a semiconductor film exemplified by a polycrystalline silicon film doped with impurity element of phosphorous or the like, or an AgPdCu alloy may be applied to. Furthermore, as for the first insulating film 42, the second insulating film 44, the third insulating film 46, the fourth insulating films 48a, 48b, and the bank 54, may be formed with a single layered or double or more layered film of a insulating film (silicon oxide film, silicon nitride film, silicon nitride/oxide film or the like), which is comprised of silicon as the major component, or an organic resin film by means of application, plasma CVD, sputtering, LPCVD or the like. Still further, semiconductor layers including 43a-43c and 45a-45c may be formed into a film respectively using silicon or silicon germanium ($Si_xGe_{1-x}$(X=0.0001-0.02)) alloy or the like by known means (sputtering, LPCVD, plasma CVD or the like) and crystallize the same.

Figure 2B:
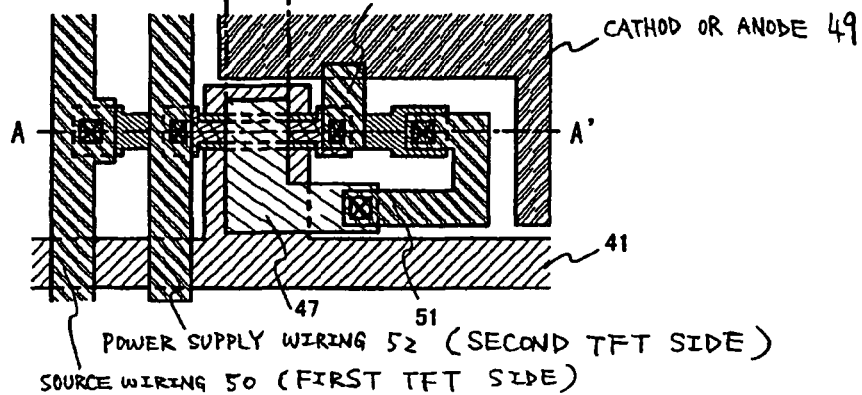

FIG. 2B shows a top view. The sectional view taken along the chain line in FIG. 2B corresponds to FIG. 2A.

Since FIG. 2A and FIG. 2B are illustrations showing the stage that the cathode or anode of the OLED has been formed, either the organic light-emitting layer or the anode or cathode formed thereon is not shown. Further, in FIG. 2, although holding capacity is not shown, the holding capacity may be provided or may not be provided in accordance with the driving method of the OLED.

To control the current, which flows to the OLED, by means of a TFT, the methods therefor are roughly categorized into two groups. In particular, a method, in which the current is controlled within the voltage range named as saturated area, and a method, in which the current is controlled within the voltage range up to the saturated area, are available. In this specification, the range of Vd, in which the current value becomes substantially constant, in the Vd-Id curve, is defined as saturated area. The invention is not limited to the driving method of the OLED, but any driving method may be applied to.

Since the manufacturing method of the device is substantially the same as the steps described in Embodiment 1, the description thereof will be given just simply, and the points different therefrom will be described below.

First of all, a base insulating film (not shown in the drawings) is disposed on the substrate 40 having an insulated surface, and the first electrode 41, which will become the gate electrode of a first TFT, is formed. Then, the first insulating film 42 (film thickness within a range of 50 nm-200 nm), which will become the gate insulating film of the first TFT, and a first semiconductor film (film thickness within a range of 25-200 nm) having amorphous structure are formed. Here, in order to prevent the boundary from being contaminated, the first insulating film 42 and the first semiconductor film are formed successively by means of plasma CVD without allowing the same to contact with the air.

Next, The first semiconductor film is formed into a desired configuration by means of patterning. Then, the second insulating film 44 and a second semiconductor film (film thickness within a range of 25-200 nm) having amorphous structure are formed. Here, in order to prevent the boundary from being contaminated, the second insulating film 44 and second semiconductor film are formed successively by means of plasma CVD without allowing the same to contact with that air. The film thickness of the second insulating film 44 may be selected appropriately from a range of 10 nm-2 µm.

Next, the first semiconductor layer having amorphous structure and the second semiconductor film having amorphous structure are crystallized. Although the crystallizing method is not particularly limited to, in this case, a second harmonic (532 nm) or a third harmonic (355 nm), which is output from an $YVO_4$ laser of 10 W continuous oscillation output, is applied to. Preferably, the laser beam is reformed into an elliptical form at the irradiated surface by means of an optical system, and the first semiconductor layer having amorphous structure and the second semiconductor film having amorphous structure are irradiated. The energy density at this time is required to be approximately 0.01-100 $MW/cm^2$ (preferably 0.1-10 $MW/cm^2$). The semiconductor film is irradiated while being shifted at a speed of approximately 0.5-2000 cm/s with respect to the laser beam relatively. By irradiating the laser beam to the first semiconductor layer having amorphous structure and the second semiconductor film having amorphous structure, since the absorbed heat is maintained respectively and the period of cooling time is elongated, it is possible to allow growing into a large diameter crystal. That is to say, it is possible to obtain semiconductor film, which has the crystallinity better than the case that the amorphous silicon film of single layer is crystallized by means of the continuous oscillation laser beam.

Next, after carrying out the patterning of the above-described second semiconductor film, the surface of the second semiconductor layer is rinsed to form the third insulating film 46, which is comprised of a single layer or laminated-layer of insulating film of silicon as the major component. Also, a third insulating film of oxidized film may be formed only on the surface of the second semiconductor layer by means of thermal oxidization. The third insulating film 46 will finally become the gate insulating film of the second TFT. The film thickness of the third insulating film 46 is selectable from a range of 50 nm-200 nm.

Next, the second electrode 47 is formed on the third insulating film. The second electrode 47 will finally become the gate electrode of the second TFT. In this case, although the width second electrode 47 is set to be narrower than the width of the first electrode 41 in the channel length direction, it is not limited thereto. Also, when the width of the first electrode is set to be narrower than that of the second electrode, an offset area (comprised of the same material as that of the channel forming area) is formed between the channel forming area and the source area (or drain area).

Next, by carrying out the ion doping or ion implantation using the second electrode 47 as the mask, an impurity element for imparting N-type or P-type to the two semiconductor layers is added in a manner of self-aligning to form the impurity areas 43a, 43b, 45a and 45b. Since the second electrode 47 is used as the mask, the channel length L between the first TFT of the channel forming area 43c and the second TFT of the channel forming area 45c becomes equal to each other. In the first TFT, the first electrode 41, which is the gate electrode, and the impurity areas 43a, 43b, which are the source area or drain area, are partially overlapped with each other with the first insulating film 42, which will become the gate insulating film, sandwiched therebetween. Since, in the doping, since the dopant amount to be added varies depending on the depth direction, in the area where the depth from the surface varies due to the second semiconductor layer above the same, i.e., the area adjacent to the channel forming area 43*c* in the impurity areas 43*a*, 43*b*, actually, the dopant is added at a low density, and LDD area (not shown in the Figures) is formed.

By adding N-type impurity element to the first semiconductor layer, it is possible to make the first TFT into the N-channel type TFT; while by adding P-type impurity element to the first semiconductor layer, it is possible to make the first TFT into the P-channel type TFT. Also, By adding N-type impurity element to the second semiconductor layer, it is possible to make the second TFT into the N-channel type TFT; while by adding P-type impurity element to the second semiconductor layer, it is possible to make the second TFT into the P-channel type TFT.

The practitioner of the invention can appropriately select whether the second TFT is to be the N-channel type TFT or the P-channel type TFT.

Next, in order to activate the added impurity element, heat treatment and strong light irradiation from a lamp light source or laser beam irradiation are carried out. Also, two layers may be activated simultaneously using a laser beam, which passes through the second semiconductor layer. When second harmonic-fourth harmonic are used for the activation using a solid-state laser (YAG laser, $YVO_4$ laser, YLF laser, or full-solid infrared laser of semiconductor laser excitation, or the like), which is capable of continuous oscillation, approximately 0.01-100 $MW/cm^2$ (preferably, 0.01-10 $MW/cm^2$) is required. Further, the irradiation is carried out at a speed of approximately 0.5-2000 cm/s while shifting the semiconductor film relatively with respect to the laser beam. Furthermore, the irradiation may be carried out by means of a strong light or laser beam from the both sides; i.e., from the rear-face side and the front-face side thereof. When irradiating the laser beam from the front-face side and the rear-face side makes the activation, the wavelength range of the laser beam is not particularly limited to. Along with the activation, the plasma damage to the insulating film, which becomes the gate insulating film and the plasma damage to the boundary between the insulating film and the semiconductor layer, which becomes gate-insulating film, can be restored.

Next, the lower layer 48*a* is formed as a planarizing film comprised of an organic resin, and the upper layer 48*b* is formed as an interlayer insulating film comprised of an inorganic insulating film. After carrying out a hydride treatment, the cathode or anode 49 is formed. It is selectable for a practitioner of the invention to appropriately decide whether the item 49 is to be a cathode or an anode. Although, not shown in the Figures, in the I/O terminal section, pad electrode may be formed simultaneously.

Next, using a mask, contact holes, which reach to impurity areas 43*a*, 43*b*, 45*a* and 45*b* respectively, are formed. Also, although not shown in the figures, in the I/O terminal section, a contact hole, which reaches to the first electrode 41, is formed. The contact holes, which reach to the impurity areas 45*a*, 45*b* in the second semiconductor layer, is formed inner side than the contact holes, which reach the impurity areas 43*a*, 43*b* in the first semiconductor layer. Next, a third conductive film is formed, and using a mask, wirings and electrodes 50-53, which connect electrically with the respective impurity areas, are formed. Also, the connecting electrode 53 connects electrically to the cathode or anode 49. Further, although not shown in the figures, in the I/O terminal section, an electrode, which connects the first electrode 41 and the pad electrode, is formed. Next, in order to cover the end portion of the cathode or anode 49, at the both ends thereof, an insulator 54 named as bank is formed.

FIG. 2A shows a sectional view at a point when the above-described steps have been completed; FIG. 2B is a top view thereof.

Although an example, in which two TFTs are provided to one pixel, is given here, it is needless to say that the same is not limited to that.

Further, if necessary, a passivation film (protection film) comprised of nitride film, which covers the TFTs, may be formed appropriately.

Next, on the cathode or anode 49 of which both ends are covered with bank 54, an EL layer (organic compound material layer) and an anode or cathode of the OLED is formed. In the case that the item 49 is the cathode, an anode is provided to the EL layer; while in the case that the item 49 is the anode, a cathode is provided to the EL layer. Further, although not shown in the figures, in the I/O terminal section, the cathode or anode may be functioned as the wiring common to every pixel, and a terminal electrode via the connecting wiring may be formed.

As for the EL layer, by appropriately combining with a light-emitting layer, a charge carrier layer or a charge injection layer, an EL layer (a layer for emitting light and for allowing the carrier to move) is formed. For example, an organic EL material from low molecular group or an organic EL material from high molecular group may be used. As for the EL layer, a thin film comprised of light-emitting material (singlet compound), which emits light (fluorescence) via singlet excitation, or a thin film comprised of light-emitting material (triplet compound), which emits light (phosphorescence) via triplet excitation may be used. Further, as for the charge carrier layer and the charge injection layer, an inorganic material such as silicon carbide or the like may be used. As for these organic EL material and inorganic material, a known material may be used. The EL layer is formed as a thin film layer of approximately 100 nm in thickness. Accordingly, it is necessary to increase the flatness of the surface of the item 49, which is formed as a cathode or anode.

Further, as for the material used for the cathode, it is preferred to use a metal having a small work function (typically, a metal element included in periodic function 1-familly or 2-familly) or an alloy that includes such a material. Since the smaller work function increases the light-emitting efficiency, as for the material used for the cathode, an alloy material including Li (lithium), which is one of the alkali metals, is preferred.

As for the conductive film used for the anode, a material, which has the work function larger than that of the material for forming the cathode, is used. One of the following materials such as an ITO (indium tin oxide alloy), an indium zinc oxide alloy ($In_2O_3$—ZnO), a zinc oxide (ZnO) or the like; and further, a material of which sheet resistance is lower than that of the ITO; in particular, a material such as platinum (Pt), chrome (Cr), Tungsten (W) or nickel (Ni) may be used.

By carrying out the above-described steps, a second TFT 56 of top gate type, which is connected with the OLED, and the first TFT 55 of inversed stagger type, in which the gate electrode 47 of second TFT is connected to the source area or drain area, are formed.

The top gate type second TFT 56 includes a second electrode 47 as the gate electrode, a third insulating film 46 as the gate insulating film, an impurity area 45*a*, 45*b* and a channel forming area 45*c* sandwiched between two impurity areas as the active layers, the connecting electrode 53 that connects with the impurity area 45a and the power supply wiring 52 that connects with the impurity area 45b.

Also, the inversed stagger type first TFT 55 includes a first electrode 41 as the gate electrode, the first insulating film 42 as the gate insulating film, the impurity areas 43a, 43b and the channel forming area 43c sandwiched between two impurity areas as the active layers, the connecting electrode 51 that connects with the impurity area 43b and the source wiring 50 that connects with the source wiring 50.

Next, it is preferred that any substance such as moisture, oxygen or the like, which accelerates the deterioration of the EL layer due to the oxidation, is prevented from coming therein from the external, by sealing the OLED, which has at least the cathode, the organic compound layer and the anode, by means of a protection film, a sealing substrate, a silicon oil or sealing can. However, as for the I/O terminal section, which is required to be connected with the FPC, it is not necessary to provide with a protection film or the like.

Figure 2C:
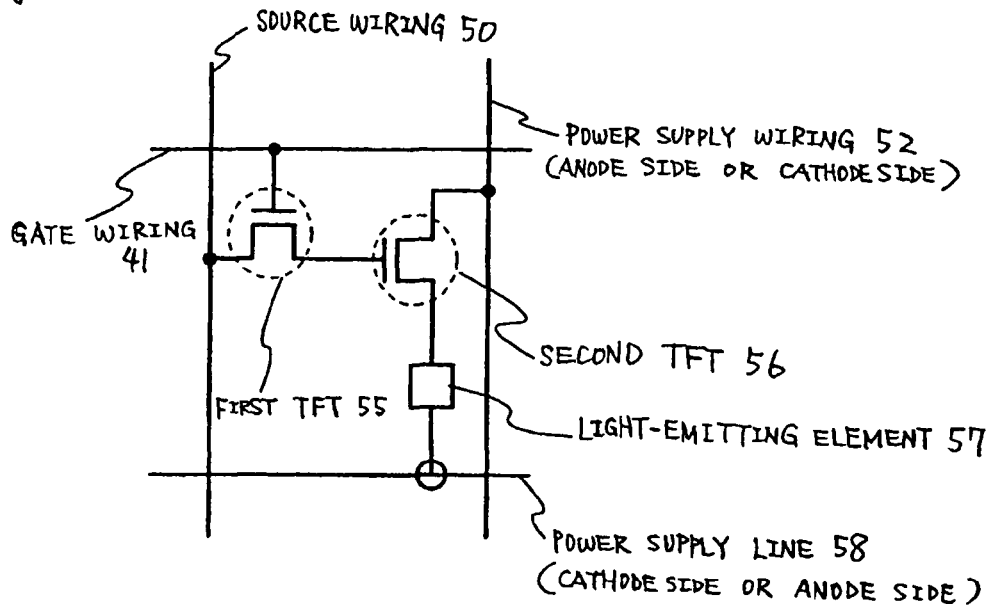

FIG. 2C shows an equivalent circuit diagram. The equivalent circuit diagram shown in FIG. 2C is the case that two TFTs are separated by the second insulating film so as not to give any influence on each other. In FIG. 2C, reference numeral 57 denotes a light-emitting element, and 58 denotes a power supply wiring.

Figure 3A:
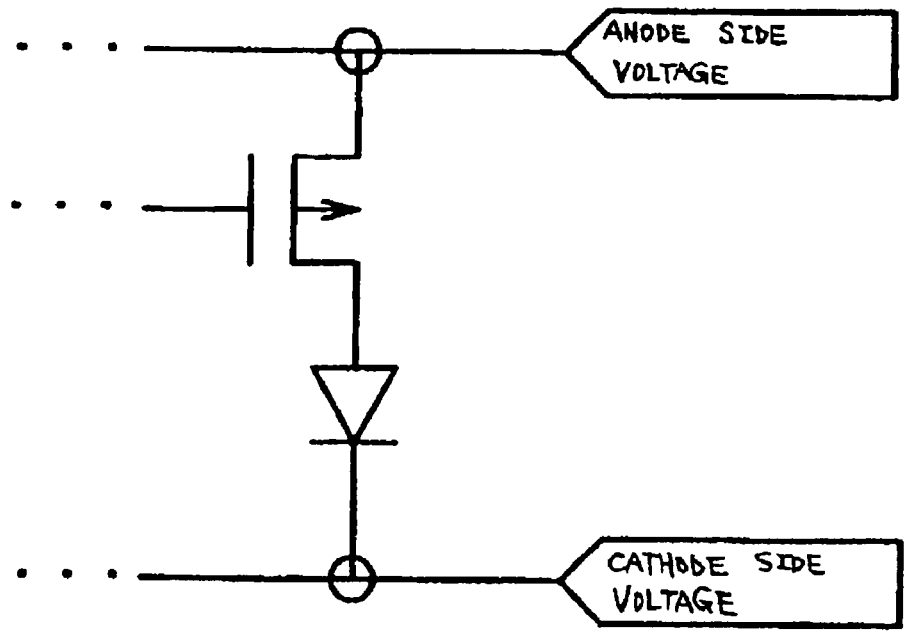
FIGS. 3A to 3B are illustrations showing Embodiment 2 (OLED)
Figure 3B:
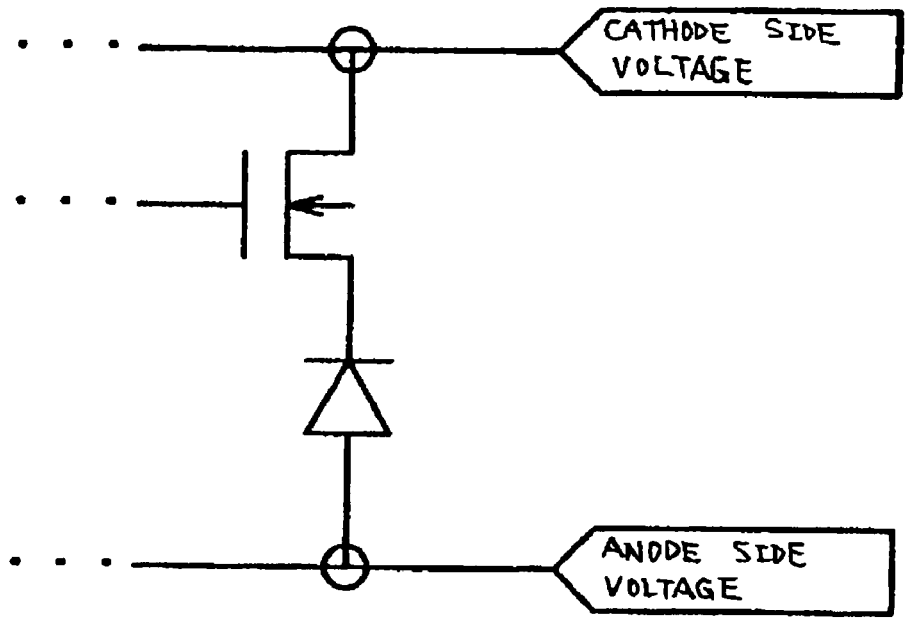

When the second TFT 56 that supplies a current to the OLED is formed as a P-channel type TFT, a connection shown in FIG. 3A is made. Also, when the second TFT 56 that supplies a current to the OLED is formed as an N-channel type TFT, a connection shown in FIG. 3B is made. In FIG. 3A and FIG. 3B, although only the TFT that supplies a current to the OLED is shown, to end of the gate electrode of the TFT, various circuits comprised of a plurality of TFTs or the like may be provided. It is needless to say that the same is not particularly specified.

When a CMOS circuit described in the Embodiment 1 is adopted, since the gate electrode is common, the upper and lower gate voltages are the same. However, in the Embodiment 2, the gate electrode is not common. In the Embodiment 2, since the voltage applied to the gate electrode 41 of the lower side is different from the voltage applied to the gate electrode 47 of the upper side, the same are driven while being scanned. That is to say, it is possible to apply a voltage from the gate electrode 41 to the second TFT 56; it is possible to apply a voltage from the gate electrode 47 to the first TFT 55. Owing to this arrangement, it is possible to obtain an effect similar to the effect of dual gate structure, in which channels (dual channel) are formed above and under one semiconductor layer; i.e., it is possible to reduce the dispersion in the threshold, and further, it is possible to reduce the OFF-current.

Under such conditions that the second TFT is the P-channel type TFT, and the first TFT is the N-channel type TFT, the gate electrode of the second TFT is in the ON-state; i.e., the same is applied with a voltage of −10V, and the gate electrode of the first TFT is in the ON-state; i.e., the same is applied with a voltage of 10V, a simulation was made. When the film thickness of the second insulating film was 100 nm and 200 nm, respectively, the S-value was 0.25V/dec. Consequently, it is possible to reduce the value lower than the S-value (0.26V/dec) of the N-channel type TFT, which was assumed as an ordinary constitution. Accordingly, it is preferred that the film thickness of the second insulating film is 100 nm or more. In the above-described simulation, it was assumed that the film quality of the semiconductor layer of the TFT of ordinary constitution and that of the semiconductor layer of the TFT according to the invention were the same. According to the invention, at the same time when the laser beam is irradiated, when the double-layered semiconductor is fused, since the absorbed heat is held each other, the period of cooling time of the fused silicon get longer compared to the case that the single-layered semiconductor is fused. As a result, a semiconductor film excellent in the crystallinity can be obtained.

According the invention, since the area occupied by a plurality of TFTs can be reduce largely, in addition to that it is possible to widen the margin for layout, each pixel size can be made further smaller resulting in a light-emitting device capable of high precise display. Further, since the area occupied by the plurality of TFTs can be reduced largely, in particular, by providing a plurality of TFTs to one pixel, when such a constitution that the area displayed of the light-emitting device is reduced is adopted, the invention is effective.

Furthermore, the Embodiment 2 may be combined appropriately with the Embodiment 1. Accordingly, when the pixel section and the drive circuit are formed on the same substrate, it is possible to miniaturize the pixel size owing to the Embodiment 2 and to miniaturize the drive circuit size owing to the Embodiment 1.

Embodiment 3

Hereinafter, a typical TFT, to which the invention is applied, and the manufacturing method thereof will be shown in FIG. 4; and FIG. 5 shows an example of a liquid crystal display device to which the invention is applied. In the Embodiments 1 and 2, examples, in which a plurality of TFTs having different constitution is formed respectively, were shown; in the Embodiment 3, a TFT having a plurality of channel forming areas will be described as an example.

First of all, on a substrate 70 having an insulated surface, a first insulating film 72, which will become a base insulating film, is formed. As for the first insulating film 72, a single or double layered insulating film comprised of silicon as the major component is formed. Although not shown in the figures, in this case, the first insulating film 72 is formed into a double-layered constitution. As the lower layer of the first insulating film 72, a silicon nitride/oxide film (composition ratio: Si=32%, O=27%, N=24%, H=17%) manufactured using raw material gases of $SiH_4$, $NH_3$ and $N_2O$ is formed 50 nm (preferably 10-200 nm) in thickness in the manner of plasma CVD, at a film forming temperature of 400° C. Next, after rinsing the surface with ozone liquid, the oxidized film on the surface is removed with dilute hydrofluoric acid (1/100 diluted). Then, a silicon nitride/oxide film (composition ratio Si=32%, O=59%, N=7%, H=2%), which is manufactured using raw material gases $SiH_4$ and $N_2O$, is laminated 100 nm (preferably 50-200 nm) in thickness to form the upper layer of the first insulating film 72 in the manner of plasma CVD at a film forming temperature 400° C. Further, without releasing into atmosphere, a first semiconductor film (in this case, amorphous silicon film) having amorphous structure is formed 54 nm (preferably 25-200 nm) in thickness in the manner of plasma CVD using film forming gas $SiH_4$ at a film forming temperature of 300° C.

Next, a mask of resist is formed, and is subjected to an etching treatment to form a first semiconductor layer 73 into a desired configuration, which is isolated like an island. After forming the first semiconductor layer 73, the mask of resist is removed.

Next, at the same time removing the oxidized film using an etchant containing hydrofluoric and rinsing the surface of the silicon film, a second insulating film 74 comprised of silicon as the major component, which will finally become a layer of the gate insulating film. In this case, a silicon nitride/oxide film (composition ratio Si=32%, O=59%, N=7%, H=2%) is formed 50 nm (preferably 1 nm-200 nm) in thickness in the manner of plasma CVD.

Next, a second semiconductor film 75 having amorphous structure is formed with a film thickness within the range of 25-200 nm. Although the materials for the first semiconductor film and the second semiconductor film are not particularly specified, preferably, using silicon or silicon germanium ($Si_xGe_{1-x}$ (X=0.0001-0.02)) alloy or the like, the films are formed by known means (spattering, LPCVD, plasma CVD or the like). The material and film thickness of the second semiconductor film may be different from those of the first semiconductor film.

Next, laser beam is irradiated to crystallize both of the above-described two layers of semiconductors (FIG. 4A). In this case, the second harmonic (532 nm) or the third harmonic (355 nm), which is output from an $YVO_4$ laser of 10 W output continuous oscillation, is applied. Preferably, the laser beam is reformed into an elliptical form at the surface to be irradiated by means of an optical system, and is irradiated to the first semiconductor layer having amorphous structure and the second semiconductor film having amorphous structure. At this time, the energy density of approximately 0.01-100 $MW/cm^2$ (preferably 0.1-10 $MW/cm^2$) is needed. The laser beam is irradiated while shifting the semiconductor film with respect thereto at a speed of approximately 0.5-2000 cm/s. By irradiating the laser beam to the first semiconductor layer 73 having amorphous structure and the second semiconductor film 75 having amorphous structure, since the absorbed heat is held respectively and the period of cooling time is elongated, it is possible to grow into a large size crystal. That is to say, it is possible to obtain a semiconductor film, which has a better crystallinity than the case that an amorphous silicon film of single layer is crystallized by means of the laser beam of continuous oscillation.

After adding metal element (typically nickel), which accelerates the crystallization of the silicon, to the second semiconductor layer, the above-described laser beam may be irradiated from the rear-face side thereof passing through the substrate. It is preferred that, in the case that the metal element is added, the film thickness of the second insulating film is 10 nm or more, and, a gettering processing is carried out in a later step to remove or reduce the same from the second semiconductor layer.

Further, if necessary, after carrying out the above-described irradiation of the laser beam from the surface (second semiconductor layer) side, the above-described irradiation of the laser beam may be carried out again passing through the substrate from the rear face (first semiconductor layer) side. When the crystallization is carried out by irradiating the laser beam from the front-face side and the rear-face side, the wavelength range of the laser beam is not particularly specified. For example, an excimer laser of 400 nm in wavelength may be used.

Next, after carrying out the above-described patterning of the second semiconductor film, the surface of the second semiconductor layer 77 is rinsed. By completing the steps up to this point, a sectional view shown in FIG. 4B is obtained. Then, a third insulating film 78 comprised of a single or laminated layer of an insulating film of silicon as the major component is formed. The third insulating film comprised of an oxidized film may be formed on the surface only of the second semiconductor layer by means of thermal oxidization. The third insulating film 78 will become finally a layer of gate insulating film. The film thickness of the third insulating film 78 is appropriately selectable within the range of 50 nm-200 nm.

Next, a first conductive film is formed, and an etching is carried out using a mask to form a first electrode 71, which will finally become a gate electrode. Then, an impurity element (P, As or the like), which imparts N-type to the semiconductor, is added using the first electrode 71 as a mask (FIG. 4C). By appropriately setting the doping conditions in accordance with the depth from the surface respectively, a desired impurity density can be added respectively to the first semiconductor layer and the second semiconductor layer, which are disposed at a different depth respectively. In this case, phosphorous is added to the second semiconductor layer 77 and the first semiconductor layer 76 in the manner of ion doping to form N-type impurity areas 80-83 in a manner of self-aligning. When the second insulating film 74 is relatively thin in thickness, the above can be achieved by one doping. Before carrying out the doping, the third insulating film 78 may be subjected to a dry etching to remove the same excluding only the portion where overlaps with the first electrode 71. The second semiconductor layer is exposed and the impurity element may be added thereto. Furthermore, when the selective ratio between the second semiconductor layer and the second insulating film is large, before and after carrying out the doping, the first semiconductor layer may be exposed excluding the portion where overlaps with the second semiconductor layer in the second insulating film by means of dry etching. When the first semiconductor layer and the second semiconductor layer have been exposed, the latter step; i.e., the step in which contact holes reaching to the first semiconductor layer are formed can be carried out easily.

Next, in order to activate the added impurity element, heat treatment and strong light irradiation from a lamp light source or laser beam irradiation are carried out. Also, two layers may be activated simultaneously using a laser beam, which passes through the second semiconductor layer. When second harmonic-fourth harmonic are used for the activation using a solid-state laser (YAG laser, $YVO_4$ laser, YLF laser, or full-solid infrared laser of semiconductor laser excitation, or the like), which is capable of continuous oscillation, approximately 0.01-100 $MW/cm^2$ (preferably, 0.01-10 $MW/cm^2$) is required. Further, the irradiation is carried out at a speed of approximately 0.5-2000 cm/s while shifting the semiconductor film relatively with respect to the laser beam. Furthermore, since there is no wiring or the like at the lower side of the double-layered, it is desired that by irradiating strong light or laser beam from the rear-face side or both sides of the rear-face side and the front-face side. When the activation is carried out by irradiating the laser beam from the front-face side and the rear-face side, the wavelength range of the laser beam is not particularly specified. Also, with the activation, it is possible to restore plasma damages to the insulating film, which will become the gate insulating film and plasma damages to the boundary between the insulating film, which will become the gate insulating film, and the semiconductor layer.

Next, an interlayer insulating film 84 is formed and is subjected to hydride treatment. And then, contact holes, which reach the impurity areas 80-83, are formed using a mask. When the enough selective ratio is provided, each contact hole may be formed simultaneously; or may be formed separately; or may be formed step-by-step. The contact holes, which reach to the impurity areas 82, 83 of the second semiconductor layer 77, are formed in the area inner than the area where the contact holes, which reach the impurity areas 80, 81 of the first semiconductor layer 76. In This case, in order to be understood easily, in the sectional view, the contact holes are aligned on a horizontal line. However, it is not particularly specified, but the contact holes may be formed in a desired area by appropriately changing the configuration of the respective semiconductor layers. Next, a second conductive film is formed using a mask to form wirings 85-87 that electrically connects to the impurity areas 80-83 respectively (FIG. 4D1).

By carrying out the above-described steps, a TFT, which has the first electrode 71 as the gate electrode and a plurality of channel forming areas 88, 89 on the different layers, can be formed. Since a common gate electrode is provided, and being formed in a manner of self-aligning, it is possible to form the same channel length L. The TFT includes the source area 83, the drain area 81 and the impurity areas 80, 82 connected via the connection electrode 85. That is to say, the active layers of the TFT is such constituted so as to be included separately on the different layer respectively. The direction of the carrier flow in the channel forming area 88 is opposite to the direction of the carrier flow in the channel forming area 89.

FIG. 4D2 shows an example of a top view. The sectional view taken along the chain line A-A' in FIG. 4D2 corresponds to FIG. 4D1. It is needless to say that the invention is not limited to the top view.

FIG. 4D3 shows an example of an equivalent circuit diagram. Referring to the equivalent circuit diagram, although the equivalent circuit is substantially the same as the conventional double gate structure, since the distance between each of the channel forming areas 88, 89 and the gate electrode 71 is different from each other, the same is different from the conventional double gate constitution. Further, since it is not necessary to dispose the gate electrodes in parallel, it is possible to miniaturize the occupied area than that of the TFT having a conventional double gate constitution. Even when the semiconductor layer of the upper side is in the conductive state being applied with a voltage to the gate electrode 71, unless the semiconductor layer of the lower side is not in the conductive state, the TFT as a whole does not gets into the ON-state. Accordingly, actual gate insulating film becomes a combination of the third insulating film 78 and the second insulating film 74. By adapting the film thickness of an actual gate insulating film, it is possible to appropriately set the OFF-current value and the threshold. Additionally, it is understandable that also the channel forming area 89 of the upper side functions as a part of the gate insulating film. By constituting such TFT as described above, it is possible to reduce the OFF-current value and a current leak.

In this case, although such a constitution that, by forming the second insulating film thin, ON/OFF control is made by applying a voltage to the semiconductor layer of the lower side, is adopted, by adopting such a constitution that the second insulating film is formed thicker, or using a material which has an extremely small permittivity, it is possible to make the semiconductor layer of the lower side function as a resistance element.

FIG. 5 illustrates an example of liquid crystal display device to which the above-described TFT is applied. For the same portions in FIG. 5, which are the same as those in FIG. 4, the same reference numerals are used.

In the pixel section of a active matrix type liquid crystal display device, a TFT (pixel TFT) is provided to each of several hundred thousands to several million pixels, and each of the pixel TFTs is provided with a pixel electrode.

Figure 5A:
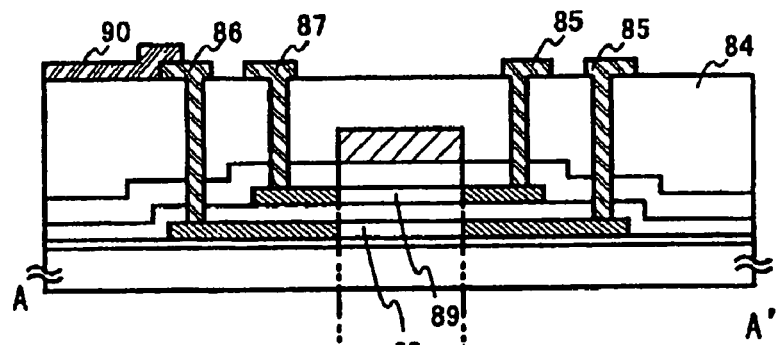
FIGS. 5A to 5C are illustrations showing Embodiment 3 (LCD)
Figure 5B:
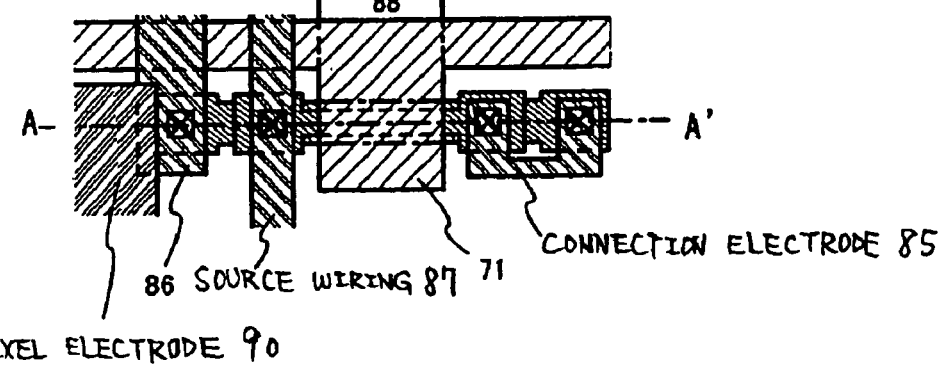

FIG. 5A shows a sectional view of a switching element and the periphery thereof, which are disposed in a pixel of an active matrix substrate; and FIG. 5B shows a top view thereof. Points different from FIG. 4A are that, a pixel electrode 90 is provided to a drain wiring 86 that connects to the semiconductor layer of the lower layer; the drain wiring 86 is overlapped with the gate wiring 71 with fourth insulating film 84 sandwiched therebetween. In this case, it is an active matrix substrate which is used as a transmission type liquid crystal display device, in which transparent conductive film (ITO (indium tin oxide alloy), an indium zinc oxide alloy (In$_2$O$_3$—ZnO), a zinc oxide (ZnO) or the like) is used as the pixel electrode 90. A holding capacity is comprised of the drain wiring 86 and the gate wiring 71 using the fourth insulating film 84 as the dielectric.

In the Embodiment 3, although an example of a transmission type liquid crystal display device will be described, when a material (Ag, Al or the like), which has a reflectivity, is used as a material to form the pixel electrode, it is possible to manufacture a reflection type liquid crystal display device.

After obtaining an active matrix substrate, in which TFTs shown in FIG. 5A are disposed in a matrix-like configuration, an orientation film is formed on the active matrix substrate, and is subjected to a rubbing processing. In this case, before forming the orientation film, pole-like spacers are formed at desired positions for maintaining the distance of the substrate by patterning an organic resin film comprised of an acrylic resin film or the like. In place of the pole-like spacer, sphere-like spacers may be splayed all over the substrate surface.

Next, an opposed substrate is prepared. On the opposed substrate, a color filter, in which a coloring layer and a light-shielding layer are disposed corresponding to each pixel. Also, the light-shielding layer is provided to the drive circuit portion. A planarizing film, which covers the color filter and the light-shielding layer, is provided. Then, on the planarizing film, an opposed electrode comprised of a transparent conductive film is formed in the pixel section, and all over the opposed substrate, an orientation film is formed, and the same is subjected to a rubbing processing.

Then, the active matrix substrate and the opposed substrate are bonded with a sealing material. Filler is mixed in the sealing material, and two substrates are bonded while keeping an even distance therebetween owing to the filler and the pole-like spacer. Next, liquid crystal material is injected between both substrates and sealed perfectly by means of sealant. As for liquid crystal material, a known liquid crystal material may be used. Thus, active matrix type liquid crystal display device is completed.

Figure 5C:
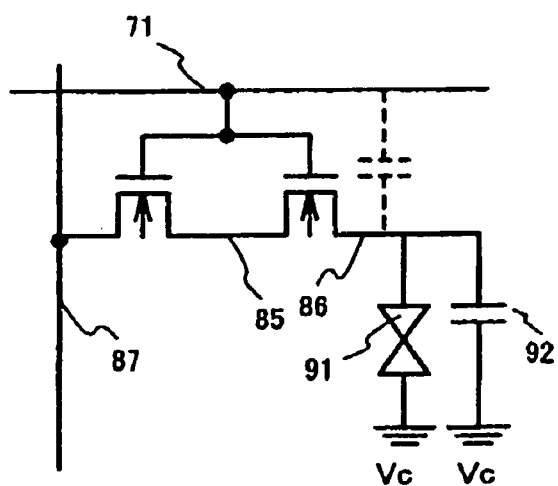

FIG. 5C shows an equivalent circuit diagram of an active matrix type liquid crystal display device. Although not shown in FIG. 5B, a holding capacity 92 is formed in another place. At the opposed substrate side, which sandwiches liquid crystal, an opposed electrode is provided to form a kind of capacitor 91, which uses the liquid crystal as the dielectric. It is adapted that a voltage to be applied to each pixel is controlled by means of switching function of the TFT, the liquid crystal is driven by controlling the charge to the capacitor, and thus by controlling the transmitting light, images are displayed.

The pixel TFT is comprised of an N-channel type TFT, which is formed by following the steps shown in FIG. 4, and the same, as the switching element, applies a voltage to the liquid crystal to drive the same. Since the liquid crystal is driven with AC current, a method called as frame inversion drive is adopted in many cases. In this method, in order to reduce the power consumption, since an important characteristic required to the pixel TFT is to reduce substantially the OFF-current value (drain current which flows when the TFT is in OFF operation), the TFT according to the invention is useful for the pixel TFT.

According to the invention, it is possible to manufacture a TFT, of which OFF-current value is sufficiently small, in a small area. Also, the TFT shown in FIG. 4 comprises one gate electrode. Since it is not necessary to dispose the gate electrodes in parallel, it is possible to form the occupied area smaller than that of the TFT of a conventional double gate constitution. In the TFT of a conventional double gate constitution, since two gate electrodes are disposed in parallel, the length in the channel length direction requires, at least, the width for two gate electrodes and the width between the gate electrodes, these lengths were decided depending on the patterning accuracy. On the other hand, according to the invention, at least, as for the length in the channel length direction, only the width of one gate electrode is enough. As a result, according to the invention, since it is possible to largely miniaturize the area occupied by the TFT, it is possible to enlarge the margin for layout, and in the transmission type liquid crystal display device, it is possible to contribute to increase the aperture ratio.

Further, in the Embodiment 3, an example an N-channel type TFT is manufactured by adding an N-type impurity element has been described. However, it is possible that, in place of the N-type impurity element, by adding a P-type impurity element, a P-channel type TFT also can be manufactured.

Furthermore, in the Embodiment 3, an example of a top gate type TFT has been described. However, in place of the gate electrode, which is disposed above the second semiconductor layer, by disposing the gate electrode below the first semiconductor layer, an inversed stagger type TFT can be obtained.

Still further, the Embodiment 3 can be combined with the Embodiment 1 and the Embodiment 2 appropriately.

The invention constituted as described above will be described further in detail based on examples given below.

EXAMPLES

Example 1

In Example 1, an example of concrete circuit constitution in an EL module is shown in FIG. 8 and FIG. 9.

Figure 8A:
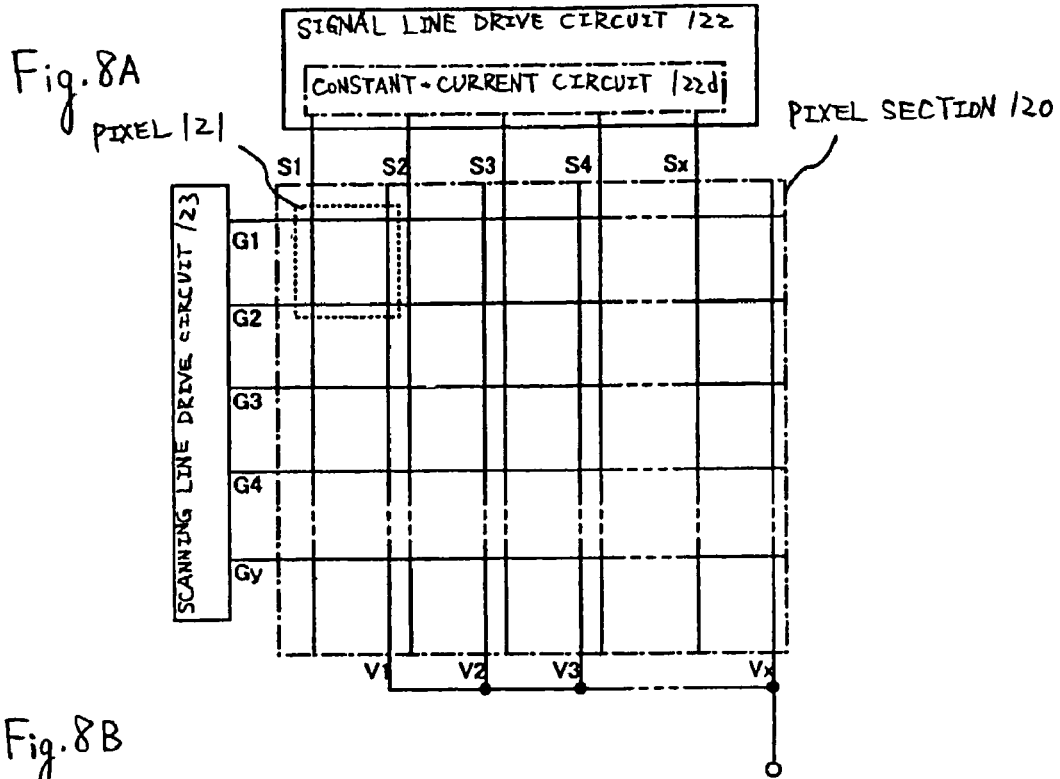
FIGS. 8A to 8B are block diagrams in a drive circuit (Embodiment 1)

In FIG. 8A, reference numeral 120 denotes a pixel section, and a plurality of pixels 121 is formed in a matrix configuration. Reference numeral 122 denotes signal line drive circuits (source wiring side drive circuits), and 123 denotes scanning line drive circuits (gate wiring side drive circuits).

An example of detailed constitution of the pixel 121 shown in FIG. 8A is shown in FIG. 2. Since the constitution shown in FIG. 2 is the same as that of the above-described Embodiment 2, in this case, detailed description thereof will be omitted. The pixel 121 shown in FIG. 8 includes at least an OLED, which is a light-emitting element, a TFT, which is connected to the OLED to supply a current, a TFT, which is connected to the TFT, a signal line Si (one of Sl-Sx), a scanning line Gj (one of Gl-Gy), a power supply line Vi (one of Vl-$V_x$). Further, although the pixel shown in FIG. 2 is not provided with any holding capacity, the holding capacity may be provided thereto. It is needless to say that the pixel constitution is not limited to that shown in FIG. 2.

In FIG. 8A, although the signal line drive circuits 122 and the scanning line drive circuits 123 are formed on the same substrate as that of the pixel section 120, the invention is not limited to that constitution. A part of the signal line drive circuits 122 and the scanning line drive circuits 123 may be formed on a substrate different from that of the pixel section 120 and be connected to the pixel section 120 via a connector such as an FPC or the like. Also, in FIG. 8A, each one signal line drive circuits 122 and scanning line drive circuits 123 are provided, the invention is not limited that constitution. The designer can appropriately decide the number of the signal line drive circuits 122 and the scanning line drive circuits 123.

In this specification, the term "connection" means electrical connection.

In FIG. 8A, signal lines Sl-Sx, power supply lines Vl-Vx and wirings for applying a voltage on scanning lines Gl-Gy are connected to the pixel section 120. The number of the signal lines and the power supply lines are not always the same. In addition to these wirings, other different wirings may be provided.

The power supply lines Vl-Vx are maintained at a predetermined electric potential. In FIG. 8A, although a constitution of a light-emitting device for displaying monochrome images, the invention may be a light-emitting device for displaying color images. In that case, the electric potential of the power supply lines Vl-Vx may not be maintained at the same level, but the same may be changed based on the corresponding colors.

Figure 8B:
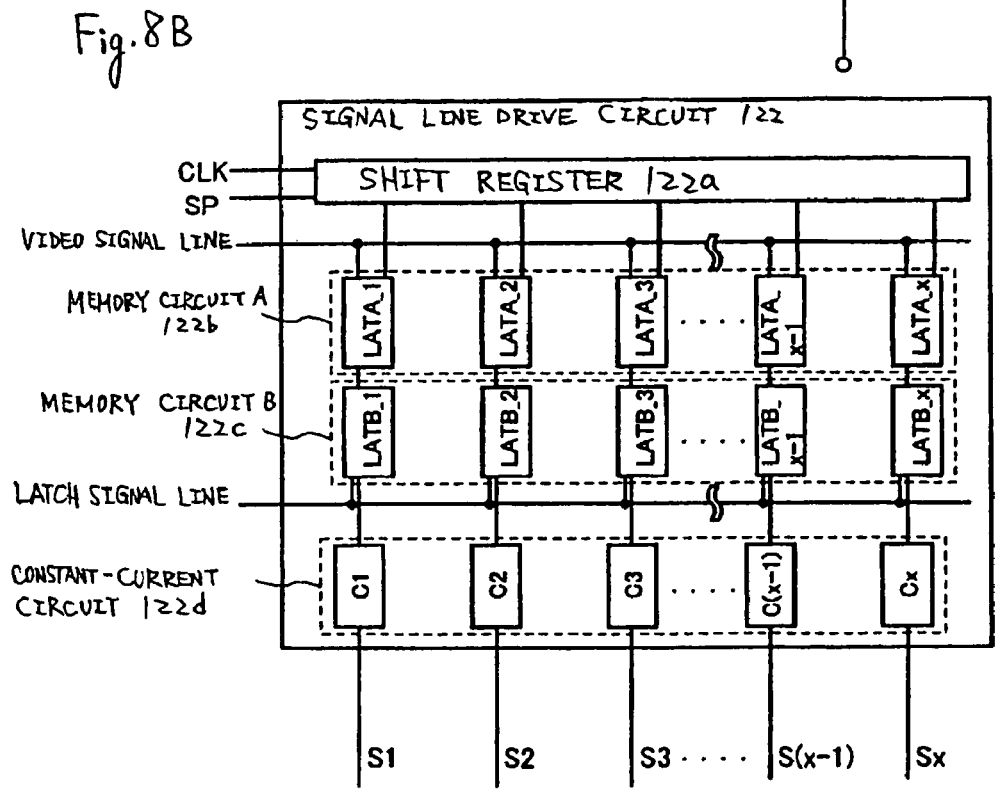

FIG. 8B is a block diagram illustrating an example of a detailed constitution of the signal line drive circuits 122 shown in FIG. 8A. Reference numeral 122a denotes a shift register, 122b denotes memory circuits A, 122c denotes memory circuits B, and 122d denotes constant-current circuits.

Clock signals CLK and start pulse signals SP are input to the shift register 122a. Also, digital video signals are input to the memory circuits A 122b, and latch signals are input to the memory circuits B 122c. Fixed signal currents Ic output from the constant-current circuits 122d are input to the signal line.

By inputting the clock signals CLK and the start pulse signals SP from a predetermined wiring to the shift register 122a, timing signals are generated. The timing signals are input to a plurality of latches A(LATA_1-LATA-x) included in the memory circuits A 122b. It may be constituted so that the timing signals generated in the shift register 122a are buffered and amplified by means of a buffer or the like, and then, be input respectively to the plurality of latches A (LATA_1-LATA x) included in the memory circuits A 122b.

When the timing signals are input to the memory circuits A 122b, synchronizing to the timing signals, digital video signals for 1 bit, which are input to a video signal line, are written on each of the plurality of latches A(LATA_1-LATA_x) in order and stored therein.

In this case, when the digital video signals are input to the memory circuits A 122b, although the digital video signals are input to the plurality of latches A (LATA_1-LATA_x) included in the memory circuits A 122b in order, the invention is not limited to that constitution. So-called slit drive, in which latches of a plurality of stages included in the memory circuits A 122b are divided into several groups, and the digital video signals are input to each group parallelly and simultaneously, may be carried out. In this case, the number of the groups is named as number of splits. For example, latches are divided into groups based on four stages; it is expressed as "four-split drive".

The period of time until every writing of digital video signals to the latches of all stages in the memory circuits A 122b has completed is named as "line period". Actually, there may be a case that a period, in which the period of horizontal retrace is added to the above-described line period, is included in the line period.

After 1 line period has completed, latch signals are supplied to a plurality of latches B(LATB-1-LATB_x) included in the memory circuits B 122c via a latch signal line. At this time, the digital video signals, which are stored in the plurality of latches A(LATA_1-LATA_x) included in the memory circuits A 122b, are written at a time on the plurality of latches B(LATB_1-LATB-x) included in the memory circuits B 122c and stored therein.

To the memory circuits A 122*b*, which has transmitted the digital video signals to the memory circuits B 122*c*, based on the timing signals from the shift register 122*a*, the next digital video signals for 1 bit are written in order.

During 1 line period of the second turn, the digital video signals written and stored in the memory circuits B 122*c* are input to the constant-current circuits 122*d*.

FIG. 9A illustrates a more detailed constitution of a current setting circuit C1. The current setting circuits C2-Cx also have the same constitution. Further, FIG. 9B shows equivalent circuits of the SW and the Inb in the FIG. 9A. It is possible to apply the invention to the SW and the Inb, and the area occupied by the drive circuit can be reduced. When the invention is applied to, it is preferred to align the same to the constitution of the pixel section. In FIG. 2, since the lower side is an N-channel type TFT and the upper side is a P-channel type TFT, likewise, the SW and the Inb are also made into the same constitution, and the size thereof is adapted to a size in accordance with the SW and the Inb respectively. As for the Inb, an example of application will be described in Embodiment 1.

The current setting circuit C1 includes a constant-current source 131, four transmission gates SW1-SW4 and two inverters Inb1, Inb2. The polarity of the transistor 130 included in the constant-current source 131 is the same as the polarity of the transistor included in the pixel.

The switching of SW1-SW4 is controlled by the digital video signals output from the LATB-1 included in the memory circuits B 122*c*. The digital video signals input to SW1 and SW3 and the digital video signals input to SW2 and SW4 are inverted by Inb1 and Inb2. Accordingly, when SW1 and SW3 are ON, SW2 and SW4 are OFF; when SW1 and SW3 are OFF, SW2 and SW4 are ON.

When SW1 and SW3 are ON, a current Ic of predetermined value not 0 is input from the constant-current source 131 to the signal line Sl via SW1 and SW3.

On the contrary, when SW2 and SW4 are ON, the current Ic from the constant-current source 131 is allowed to flow to the ground via SW2. Also, a power potential of power supply line Vl-Vx is given to the signal line Sl via SW4 resulting in Ic≈0.

Referring to FIG. 8B again, the above-described operation is carried out simultaneously within 1 line period in every current setting circuit (Cl-Cx) included in the constant-current circuits 122*d*. Accordingly, the values of the signal current Ic to be input to every signal line are selected based on the digital video signals.

Next, the constitution of the scanning line drive circuits 123 will be described.

The scanning line drive circuits 123 have a shift register and a buffer respectively. Also, depending on the case, a level shifter may be included.

In the scanning line drive circuits, when clock CLK and start pulse signal SP are input to the shift register, timing signals are generated. The generated timing signals are buffered and amplified in the buffer, and are supplied to the corresponding scanning line respectively. It is possible to apply the invention to the buffer circuit and the area occupied by the drive circuit can be reduced.

To the scanning line, gates of transistors for 1 pixel line are connected. And since it is necessary to turn on the transistors of the pixels for 1 line simultaneously, a buffer capable of flowing a large current is used.

In place of the shift register, for example, another circuit such as a decoder circuit, which is capable of selecting the scanning line, may be used.

The voltage of each scanning line may be controlled by a plurality of scanning line drive circuits corresponding to each scanning line, or, one scanning line drive circuit may control the voltage of several scanning lines or of all scanning lines.

It is needless to say that the signal line drive circuits 122 and the scanning line drive circuits 123 that drive the semiconductor device having the OLED according to the invention are not limited to the constitution described herein.

According to Example 1, by applying Embodiment 2 to the above-described pixel constitution, it is possible to largely reduce the area, which is occupied by a plurality of TFTs in one pixel of the pixel section. Additionally, by applying Embodiment 1 to a part or all of the CMOS circuits in the above-described drive circuits, it is possible to largely reduce the area, which is occupied by the CMOS circuits in the drive circuits. Further, according to the Example 1, it is possible to combine the Embodiment 1 and the Embodiment 2 appropriately with each other.

FIG. 10 is an external view illustrating an example of an EL module, which is completed by applying Embodiment 1 and Embodiment 2. FIG. 10A is a top view of a module having an OLED, i.e., an EL module. FIG. 10B is a sectional view taken along the line A-A' in FIG. 10A. On a substrate 200 (for example, a glass substrate, a crystallized glass substrate or, a plastic substrate or the like) having a insulated surface, a pixel section 202, source-side drive circuits 201 and a gate-side drive circuit 203 are formed. The source-side drive circuits 201 correspond to the signal line drive circuits 122 in FIG. 8, the gate-side drive circuits 203 correspond to scanning line drive circuits 123 in FIG. 8 and the pixel section 202 corresponds to the pixel section 120 in FIG. 8, respectively. These pixel section and drive circuits can be obtained by following the above-described Embodiment 1 or Embodiment 2.

Reference numeral 218 denotes a sealing material and 219 denotes a protection film. The pixel section and the drive circuit section are covered by the sealing material 218, the sealing material is covered by the protection film 219; and further sealed by a cover material 220 using an binding material. As for the cover material 220, a base material of any composition such as plastic, glass, metal, ceramic or the like may be used. Also, the configuration of the cover material 220 and the configuration of the support are not particularly limited to; any material having plane surface, curved surface or flexibility or film-like configuration is usable. In order to withstand against any deformation due to heat, an external force or the like, as for the cover material 220, it is desired to use the same material as the substrate 200, such as a glass substrate. In Example 1, a concave configuration (3-10 μm in depth) shown in FIG. 10 is formed by means of sandblast or the like. It is desired to further process to form a concave portion (50-200 μm in depth) for disposing a drying agent 221. Furthermore, in order to protect an EL layer 216, a space between the substrate 200 and the cover material 220 may be filled with silicon oil. Further, in the case that the EL module is manufactured in a multi-substrate processing method, after the substrate and the cover material are bonded with together, each EL module may be cut off using $CO_2$ laser or the like so that the edge faces thereof are aligned with each other.

Although, not shown herein in the drawings, in order to prevent any background from being reflected due to reflection of a used metal layer (in this case, cathode or the like), a circular polarizing means called as circular polarizing plate comprised of a phase shift film (λ/4 plate) or a polarizing plate may be provided to the substrate 200.

Reference numeral 208 denotes a wiring, which transmits signals to be input to the source-side drive circuits 201 and the gate-side drive circuits 203, and the same receives video signals and clock signals from an FPC (flexible printed circuit) 209, which is an external input terminal. According to the Example 1, the light-emitting device may be driven in a digital or analog manner; and the video signals may be digital signals or analog signals. Further, although not shown here in the drawings, a printed wiring board (PWB) may be mounted to this FPC. The light-emitting device set for thin this specification should be understood that not only the light-emitting device main body, but also the same in a state that a FPC or a PWB is mounted thereto. Further, although it is also possible to form a complicated integrated circuit (CPU, controller or the like) on the same substrate as that of the pixel section and the drive circuit, it is difficult to manufacture the same using a small number of masks. Accordingly, it is preferred that an IC chip equipped with a CPU, a controller or the like is mounted in a manner of COG (chip on glass), TAB (tape automated bonding) or wire bonding.

Next, referring to FIG. 10B, the sectional constitution will be described below. On the substrate 200, an insulating film 210 is formed, and above the insulating film 210, the pixel section 202 and the gate-side drive circuits 203 are formed. The pixel section 202 comprises a current controlling TFT 211a, a pixel electrode 212b, which is electrically connected to the drain thereof, and a plurality of pixels including a switching TFT 211b. However, the constitution of a pixel is not limited to the pixel constitution described above (two TFTs in one pixel), but a plurality of TFTs and circuits may be built in one pixel. Various circuits provided in the gate-side drive circuits 203 are formed using a CMOS circuit, in which an N-channel type TFT 213 and a P-channel type TFT 214 are combined with each other.

According to the Example 1, an N-channel type TFT of inversed stagger type is used as the switching TFT 211b; while, a P-channel type TFT of top gate type is used as the current controlling TFT 211a. However, the invention is not limited to that constitution. The switching TFT and the current controlling TFT may be the P-channel type TFT or the N-channel type TFT. When the anode of the OLED is used as the pixel electrode, it is desired that the current controlling TFT is a P-channel type TFT; while, when the cathode of the OLED is used as the pixel electrode, it is desired that the current controlling TFT is an N-channel type TFT.

The pixel electrode 212b, which is electrically connected to a connection electrode 212a, one impurity area of the current controlling TFT 211a, is made to function as the anode of the OLED. Furthermore, at the both ends of the pixel electrode 212b, a bank 215 is formed respectively; and on the pixel electrode 212b, a cathode 217 of the EL layer 216 and the OLED is formed.

The cathode 217 functions as the wiring, which is common to every pixel, as well, and is electrically connected to the FPC 209 via the connection wiring 208. Since the smaller work function results in the higher light-emitting efficiency, particularly, as for the material used for the cathode, it is desired to use an alloy material including Li (lithium), which is a one of alkaline metal. Further, the elements included in the pixel section 202 and the gate-side drive circuits 203 are all covered by the cathode 217, the sealing material 218 and the protection film 219.

As for the sealing material 218, it is desired to use a material, which is transparent or semitransparent with respect to the visible radiation. Also, as for the sealing material 218, it is desired to use a material, which does not allow moisture or oxygen to pass through as possible. Further, the sealing material may not be provided particularly.

Furthermore, it is desired that, after the OLED has been completely covered with the sealing material 218, as shown in FIG. 10, the protection film 219 comprised of single layer or laminated-layer selected from AlON film, AlN film, $Al_2O_3$ film, or DLC film is provided on the surface (exposed surface) of the sealing material 218.

By sealing the OLED with a protection film having the above-described structure, it is possible to shut out the OLED from the external, and to prevent any substance such as moisture, oxygen or the like, which accelerates deterioration due to the oxidation of the EL layer, from coming in from the external. Accordingly, it is possible to obtain a highly reliable light-emitting device.

Furthermore, such a constitution that the cathode is used as the pixel electrode, and by building up the EL layer and the anode so as to emit light in the opposite direction shown in FIG. 10, may be adopted. To emit light toward the opposite direction, it is realized by forming the cover material with a material, which allows light to transmit, and by providing a circular polarizing means to the cover material.

Example 2

Figure 11:
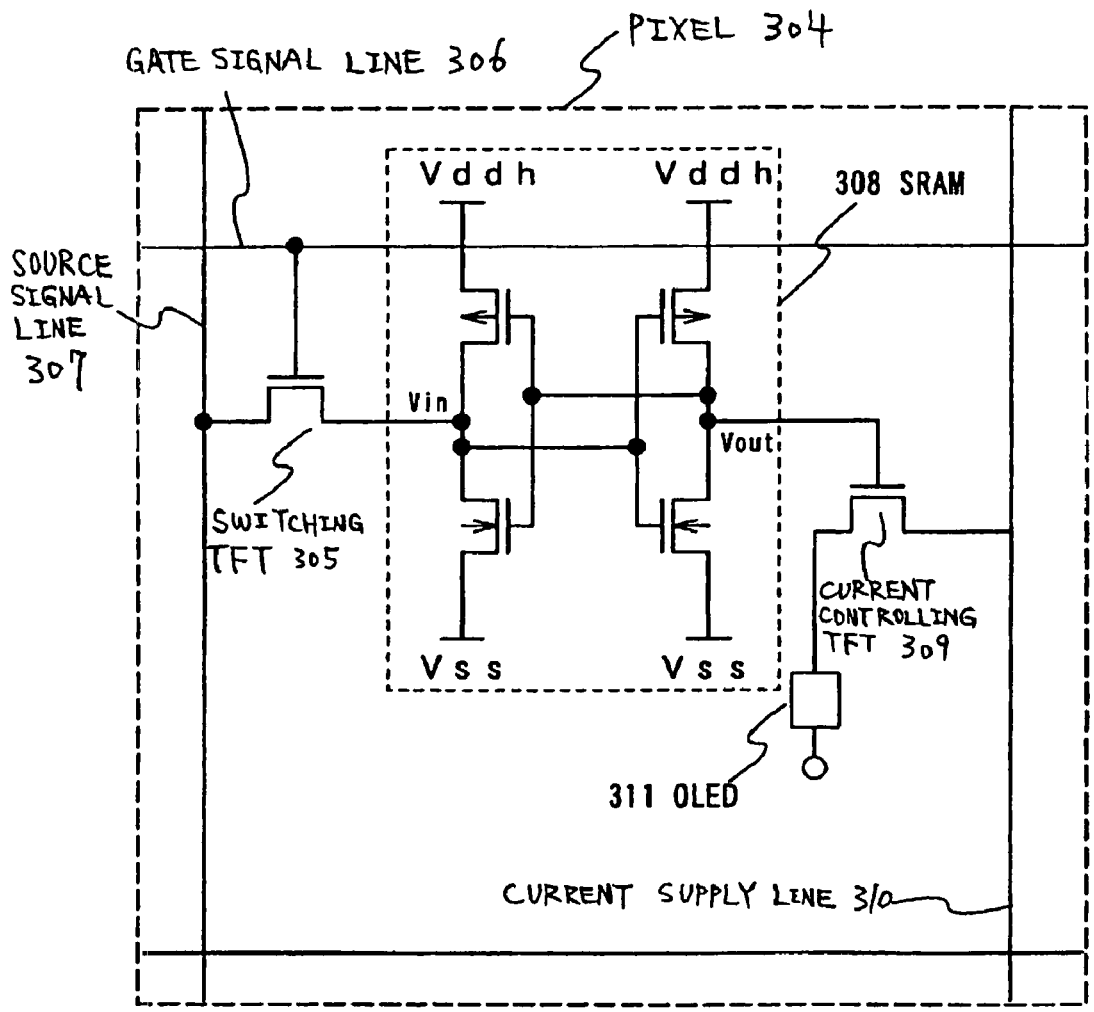
FIG. 11 is a circuit diagram showing a constitution of a pixel (Embodiment 2)

In Example 2, an example, which has a pixel constitution different from that described in the Embodiment 1 and the Example 1, in particular, memory element (SRAM) is incorporated into each pixel, will be described. FIG. 11 shows an equivalent circuit diagram of one pixel.

Referring to FIG. 11, reference numeral 305 is a switching TFT. The gate electrode of the switching TFT 305 is connected to a gate signal line 306, which is a one of the gate signal lines (G1-Gn) that inputs gate signals. One of the source area and the drain area of the switching TFT 305 is connected to one of the source signal lines 307, which is one of the source signal lines (S1-Sn) that inputs signals; and the other one thereof is connected to the input side of a SRAM 308. The output side of the SRAM 308 is connected to the gate electrode of a current controlling TFT 309.

Further, one of the source area and the drain area of the current controlling TFT 309 is connected to a current supply line 310, which is one of the current supply lines (V1-Vn); and the other one thereof is connected to an OLED 311.

The OLED 311 is comprised of an anode, a cathode and an EL layer, which is disposed between the anode and the cathode. When the anode is connected to the source area or the drain area of the current controlling TFT 309; in other words, in the case that the anode is the pixel electrode, the cathode is the opposed electrode. On the contrary, when the cathode is connected to the source area or drain area of the current controlling TFT 309; in other words, in the case that the cathode is the pixel electrode, the anode is the opposed electrode.

The SRAM 308 has two P-channel type TFTs and N-channel type TFTs respectively; the source area of the P-channel type TFT is connected to Vddh at the high voltage side, the source area of the N-channel type TFT is connected to the Vss at the low voltage side, respectively. One P-channel type TFT and one N-channel type TFT make a pair; accordingly, two pairs of the P-channel type TFT and the N-channel type TFT included in one SRAM.

The pair of the P-channel type TFT and the N-channel type TFT are connected to each other via the respective drain areas. Also, the pair of the P-channel type TFT and the N-channel type TFT are connected to each other via the respective gate electrodes. And in each of pairs, the drain areas of the paired P-channel type TFT and N-channel type TFT are maintained at the same electric potential as that of the gate electrodes of the another paired P-channel type TFT and N-channel type TFT.

The drain areas of one pair of P-channel type and N-channel type TFTs are the input sides to which the input signals (Vin) are input; while, the drain areas of another pair of P-channel type and N-channel type TFTs are the output sides to which output signals (Vout) are output.

The SRAM is adapted so as to hold the Vin and output the Vout, which are the inverted signals of the Vin. That is to say, when the Vin is Hi, the Vout results in the signals of Lo equivalent to Vss; while, when the Vin is Lo, the Vout results in the signals of Hi equivalent to Vddh.

As described in Example 2, when a single SRAM is provided to a pixel 304, since memory data in the pixel is held, in a state that most external circuits have been shut down, a frozen frame can be displayed. Owing to this arrangement, smaller power consumption can be achieved.

It is possible to provide a plurality of SRAMs to the pixel. When a plurality of SRAMs is provided thereto, since a plurality of data can be held; it is made possible to perform tone display in time-tone mode.

According to Example 2, by forming and integrating at least a pair of P-channel type TFT and N-channel type TFT according to Embodiment 1 or Embodiment 2, it is possible to miniaturize the area occupied by the SRAM 308. Additionally, it is possible to integrate a pair of the switching TFT 305 and the current controlling TFT 309 according to the Embodiment 2.

Although an example in which, in a light-emitting device having an OLED, a SRAM is built in a pixel has been described here. In a liquid crystal display device also, a SRAM may be built in a pixel. By forming a SRAM, of which occupied area has been miniaturized according to the invention, in a pixel, the aperture ratio of a liquid crystal display device is increased largely.

Although, an example, in which the area occupied by a SRAM is miniaturized, has been described here; likewise, it is possible to miniaturize other memory elements, for example, the area occupied by a DRAM also can be miniaturized and built in a pixel.

The Example 2 can be combined with the Example 1, the Embodiment 1, the Embodiment 2 or the Embodiment 3 freely.

Example 3

In the Example 3, an example of a pixel, which has a configuration different from that shown in the Example 1 and Example 2, is shown in FIG. 12.

Figure 12A:
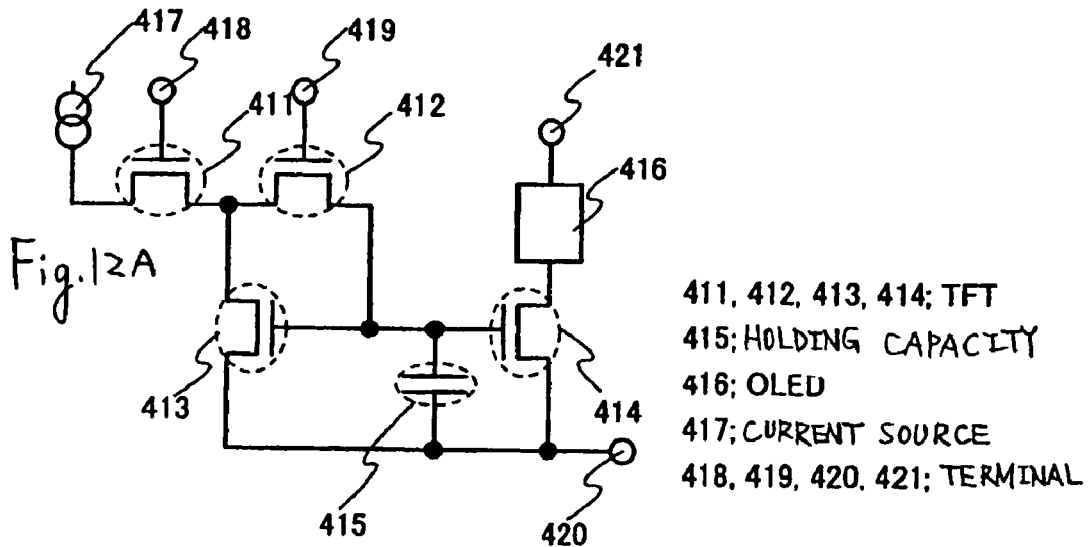
FIGS. 12A to 12B are circuit diagrams showing constitution of pixels (Embodiment 3)

The pixel shown in FIG. 12A has TFTs 411, 412, 413, 414, a holding capacity 415 and an OLED (light-emitting element) 416.

According to Example 3, four TFTs, 411, 412, 413 and 414 provided in a pixel are integrated using the Embodiment 1 or Embodiment 2 to miniaturize the area occupied thereby. Even when the TFTs are integrated, the driving method is the same. The constitution of the pixel and the driving method of the OLED will be described below.

In the TFT 411, the gate is connected to a terminal 418, one ends of the source and the drain are connected to a current source 417; the other ends thereof are connected to the drain of the TFT 413. In the TFT 412, the gate is connected to the terminal 419, one ends of the source and the drain are connected to the drain of the TFT 413; the another ends thereof are connected to the gate of the TFT 413. The TFT 413 and the TFT 414 are connected to each other and both of the sources thereof are connected to the terminal 420. The drain of the TFT 414 is connected to the anode of the OLED 416; the cathode of the OLED 416 is connected to the terminal 421.

The holding capacity 415 is provided so as to hold the voltage between the gate and the source of the TFTs 413 and 414. The terminals 420, 421 are supplied with a predetermined voltage from the power supply respectively, and each of them has a voltage difference.

After the TFTs 411, 412 turns ON due to the voltage given to the terminals 418, 419, the drain current of the TFT 413 is controlled by the current source 417. In this case, since the gate and the drain are connected to each other, the TFT 413 operates in a saturated area. In this case, the drain current of the TFT 413 varies depending on the gate voltage. Also, since the gate and the source of the TFT 413 and the TFT 414 are connected to each other, the gate voltage of the TFT 414 is held at the same voltage as the gate voltage of the TFT 413.

Accordingly, the drain currents of the TFT 413 and the TFT 414 are resulted in the proportional relationship. Particularly, when the electrical characteristic values of the TFTs are the same, the drain currents of the TFT 413 and the TFT 414 are resulted in the same. The drain current, which flows to the TFT 414, is supplied to the OLED 416; the OLED 416 emits light at a luminance corresponding to the magnitude of the drain current. Owing to the voltage given to the terminals 418, 419, even after the TFTs 411, 412 have turned OFF, while the gate voltage of the TFT 414 is held by the holding capacity 415, the OLED 416 continues to emit light.

As described above, the pixel shown in FIG. 12A includes means for converting a current supplied to the pixel into a voltage and holding the same; and means for flowing a current of a magnitude corresponding to the held voltage to the light-emitting element.

Figure 12B:
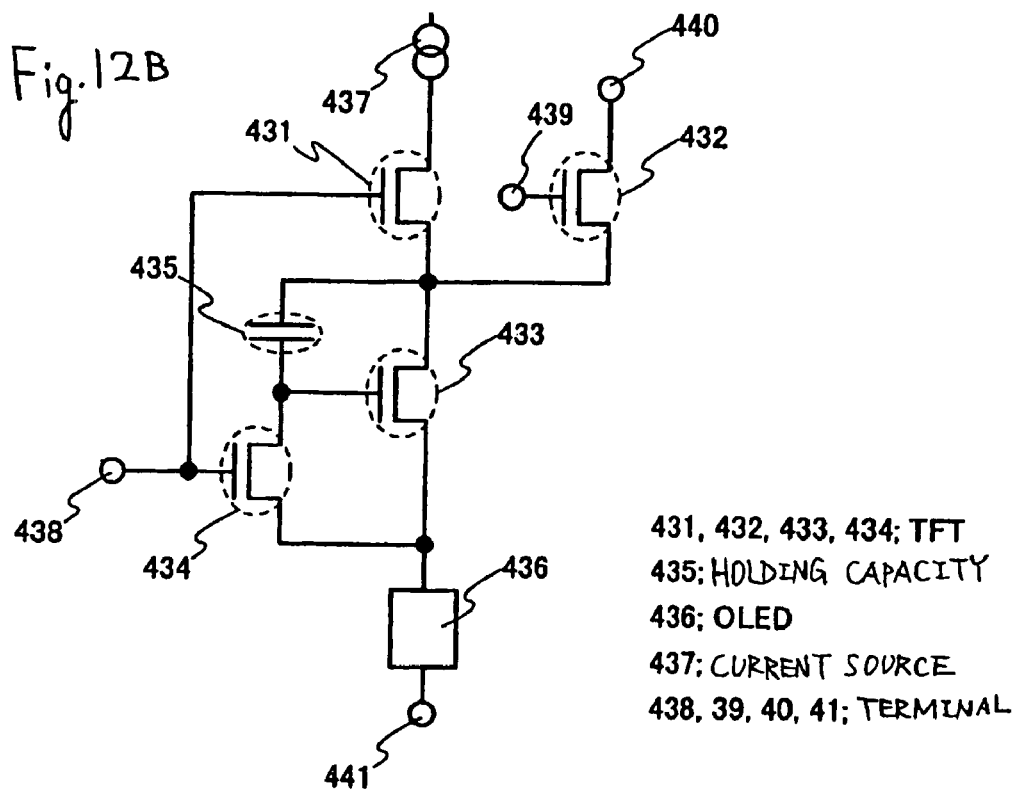

A pixel constitution different from that shown in FIG. 12A is shown in FIG. 12B. The pixel shown in FIG. 12B includes TFTs 431, 432, 433 and 434, a holding capacity 435 and an OLED 436.

According to the Example 3, four TFTs of 431, 432, 433 and 434 provided to one pixel are integrated using the Embodiment 1 or the Embodiment 2 to miniaturize the area occupied thereby. Even when the TFTs are integrated, the driving method thereof is the same. The constitution of the pixel and the driving method of the OLED will be described below.

In the TFT 431, the gate is connected to a terminal 438, one ends of the source and the drain are connected to a current source 437, The other ends thereof are connected to the source of the TFT 433. In the TFT 434, the gate is connected to the terminal 438, one of the source and the drain is connected to the gate of the TFT 433, the other end thereof is connected to the drain of the TFT 433. In the TFT 432, the gate is connected to the terminal 439; one of the source and the drain is connected to the terminal 440 and the other is connected to the source of the TFT 433. The drain of the TFT 434 is connected to the anode of the OLED 436; the cathode of the OLED 436 is connected to the terminal 441. The holding capacity 435 is provided to hold a voltage between the gate and the source of the TFT 433. A predetermined voltage is applied to the terminals 440, 441 from the power supply and each of them holds a voltage difference.

After the TFTs 431 and 434 turn ON due to the voltage given to the terminal 438 and the TFT 432 turns OFF due to the voltage given to the terminal 439, the drain current of the TFT 433 is controlled by the current source 437. Since the gate and the drain are connected to each other, the TFT 433 operates in a saturated area. In this case, the drain current of the TFT 433 varies depending on the gate voltage.

The drain current, which flows to the TFT 433, is supplied to the OLED 436, and the OLED 436 emits light at a luminance corresponding to the drain current.

After the TFTs 431, 434 are turned OFF owing to the voltage given to the terminal 438, the TFT 432 is turned ON owing to the voltage given to the terminal 439. While the gate voltage of the TFT 433 is held by the holding capacity 435, the OLED 436 continues to emit light at the same luminance as that when the TFTs 431, 434 are ON.

As described above, the pixel shown in FIG. 12B includes means for converting a current supplied to the pixel into a voltage and holding the same, and for flowing the current of a magnitude corresponding to the held voltage to the light-emitting element.

Even when the threshold of the TFT or the characteristics of the ON-current or the like is uneven among the pixels, the magnitude of the current, which flows to the OLED is controlled by the current source, the above-described pixel shown in FIGS. 12A and 12B can prevent dispersion of luminance of the OLED from occurring among the pixels.

The Example 3 can be combined with the Example 1. In place of the pixel constitution of the Example 1, the pixel constitution shown in FIGS. 12A and 12B may be used.

As described above, the invention can be applied to without depending on the constitution of the pixel or the driving method of the OLED.

Example 4

In the Embodiment 1, an example, in which two gate electrodes are provided to form a CMOS circuit, has been described. According to the Example 4, FIG. 13 shows an example, in which a CMOS circuit is formed using one gate electrode.

Steps that are the same as those of the Embodiment 3 will be omitted here. The portion in FIG. 13 that is the same as that of FIG. 4 will be given with the same reference numeral used therein.

First of all, according to Embodiment 3, a state that is the same as that shown in FIG. 4B is obtained (FIG. 13A).

Next, according to the Embodiment 3, a third insulating film of a single layer or laminated-layer, which comprises an insulating film of silicon as the major component, and a first electrode 71 is formed. Or, by means of thermal oxidization, a third insulating film of an oxidized film may be formed only on the surface of the second semiconductor layer. The film thickness of the third insulating film is selectable appropriately within a range of 50 nm-200 nm.

Next, an etching is carried out using the first electrode 71 as the mask to selectively remove the third insulating film excluding a portion where is overlapped with the first electrode 71, to form a third insulating layer 503. However, although an example, in which the third insulating layer is formed by carrying out the etching, is shown, it may not be carried out. Then, an impurity element (boron) for imparting P-type in a manner of self-aligning is added to the partially exposed second semiconductor layer using the first electrode 71 as the mask to form impurity areas 501 and 502 (FIG. 13B). In this case, since a high density doping is made using a relatively low acceleration voltage to the exposed area, little P-type impurity element is added to the first semiconductor layer.

Next, an impurity element (phosphorous) imparting N-type in a manner of self-aligning is added using the first electrode 71 as the mask to form impurity areas 504a, 504b, 505a and 505b (FIG. 13C). In this case, allowing the impurity element to pass through a second insulating film 74, a high density doping is made using a relatively high acceleration voltage. In this case, although phosphorous is added to the impurity areas 501 and 502 at a low density, since boron has been add at high density, the impurity areas 501 and 502 finally function satisfactorily as the source area or drain area of the P-channel type TFT. Also, in the area where the depth from the surface is different due to the second semiconductor layer thereabove; i.e., in the impurity areas 504b and 505b, the dopant is added at a low density forming an LDD area. Further, since the boron is small in atom size and is hard to be activated after the addition, by giving a doping damage by means of the doping of the phosphorous to make second semiconductor layer be amorphous so as to be easily crystallized (activated) again in the latter activation step.

Not being limited to the above-described doping order, after adding the impurity element for imparting N-type first, the impurity element for imparting P-type may be added.

Then, the second insulating film 74 is selectively removed using the second semiconductor layer as the mask, and the second insulating layer 506 is formed. It is important to form the second insulating layer under such etching conditions that sufficient selective ratio between the second insulating film and the second semiconductor layer is obtained; and the film thickness is the same as the second insulating film. Although an example, in which the second insulating layer is formed by carrying out the etching, is described here, the same may not be carried out.

Next, in order to activate the added impurity element, a heat treatment, an irradiation of a strong light from the lamp light source, or an irradiation of a laser beam is carried out. The activation of two layers may be carried out simultaneously using the laser beam passing through the second semiconductor layer. When the second harmonic-fourth harmonic of the basic wave are used for activation using a solid-state laser (YAG laser, $YVO_4$ laser, YLF laser or the like) capable of continuous oscillation, approximately, 0.01-100 $MW/cm^2$ (preferably, 0.01-10 $MW/cm^2$) is necessary. The irradiation is carried out while shifting the semiconductor film with respect to the laser beam at a speed of approximately 0.5-2000 cm/s. Further, since no electrode or the like resides in the lower layer of the double-layer, it is preferred to activate the double-layered semiconductor layer simultaneously by irradiating the laser beam from the rear-face side thereof. Also, the irradiation of the strong light or laser beam may be carried out from the both sides of the rear-face side and the front-face side. When the irradiation of the laser beam is carried out from the front-face side and the rear-face side to activate, the wavelength range of the laser beam is not particularly specified. Further, with the activation, it is possible to recover the plasma damage on the insulating film that becomes the gate insulating film and the plasma damage on the boundary between the insulating film that becomes the gate insulating film and the semiconductor layer.

Then, after forming an interlayer insulating film 507 and carrying out hydride treatment, contact holes that reach to the respective impurity areas are formed. In the case that the selective ratio is obtained satisfactorily, although the contact holes may be formed simultaneously, each of them may be farmed separately. The contact holes, which reach to the impurity areas 501 and 502 of the second semiconductor layer, are formed inner side than the contact holes, which reach to the impurity area 504a and 505a of the first semiconductor layer. Then, wirings 508-510, which connect electrically with the respective impurity areas, are formed (FIG. 13D1).

By carrying out the above-described steps, a P-channel type TFT 500 of top gate constitution, which is comprised of the first electrode 71 as the gate electrode; the third insulating layer 503 as the gate insulating film; the source area 502, the drain area 501 and the channel forming area 512 sandwiched between the these areas as the active layer; the source wiring 510 connecting with the source area 502; and the drain wiring 509 connecting with the drain area 501, is completed.

Additionally, an N-channel type TFT of top gate constitution, which is comprised of the first electrode 71 as the gate electrode; the third insulating layer 503 and the second insulating layer 506 as the gate insulating film; the source area 505*a*, the drain area 504*a*, the LDD areas 504*b* and 505*b* and the channel forming area 511, which is sandwiched therebetween, as the active layer; and the source wiring 508, which connects with the source area 505*a*; and the drain wiring 509, which connects with the drain area 504*a*, is completed. Further, by combining these TFTs complementally, a CMOS circuit can be manufactured.

Further, in the manufacturing process according to the invention, a CMOS circuit can be manufactured using 5 masks. Conventionally, when manufacturing CMOS circuits, which are positioned in parallel to each other, total six masks were needed for semiconductor layer patterning, gate electrode patterning, a doping mask for the impurity element that imparts N-type, a doping mask for the impurity element that imparts P-type, contact hole patterning, and wiring patterning. According to the invention, by adding one mask for semiconductor layer and reducing two doping masks, it is possible to largely miniaturize the area necessary for the CMOS circuit without increasing the number of the masks.

An example of a top view is shown in FIG. 13D2. The sectional view taken along the chain line A-A in FIG. 13D2 corresponds to FIG. 13D1.

Although the size of the first semiconductor layer is different from that of the second semiconductor layer in order to establish the contact therebetween, the configuration thereof is not particularly specified. The channel length L of the channel forming area 511 of N-channel type TFT is the same as that of the channel forming area 512 of P-channel type TFT.

FIG. 13D3 shows an example of an equivalent circuit diagram when an inverter circuit, which is one of the examples of CMOS circuits. Referring the equivalent circuit diagram, although it is almost the same as an ordinary CMOS circuit, but actually, the distances between the respective channel forming areas 511 and 512 and the gate electrodes 71 are different from each other. Therefore, the equivalent circuit is different from the ordinary CMOS circuit. Accordingly, in an N-channel type TFT, the actual gate insulating film is comprised of the third insulating layer 503 and the second insulating layer 506. Taking into the fact into the consideration, by appropriately adapting the total film thickness of these insulating layers within a range of 50 nm-200 nm, it is possible to set the OFF-current value and the threshold freely. Additionally, it is understandable that the channel forming area 512 also at the upper side functions as a part of the gate insulating film. By adopting the constitution of the TFT as described above, it is possible to reduce the OFF-current value and the current leak.

In this case, an example, in which an impurity element that imparts N-type is added to the first semiconductor layer 76; and an impurity element that imparts P-type is added to the second semiconductor layer 77, has been described. However, an impurity element that imparts P-type may be added to the first semiconductor layer 76; and an impurity element that imparts N-type may be added to the second semiconductor layer 77.

Although the TFT shown in FIG. 13D1 is of a single gate constitution, it is not limited thereto. A double gate constitution having two channel forming areas, in which two gate electrodes are placed in parallel into a plane configuration, or a multi-gate constitution having a plurality of channel forming areas more than three may be adopted.

Further, in this case, although an example of top gate type TFT has been described, in place of the gate electrode provided above the second semiconductor layer, by providing the gate electrode below the first semiconductor layer, an inversed stagger type TFT may be formed.

According to the Example 4, it is possible to largely miniaturize the area occupied by the CMOS circuit. Accordingly, it is possible to miniaturize the drive circuit including the CMOS circuit.

Furthermore, the Example 4 may be combined with any of the Embodiments 1-3 or the Embodiments 1-3 freely.

For example, when the Example 4 is combined with the Embodiment 3, a CMOS circuit according to the Example 4 may be formed by forming the pixel section and the drive circuit on the same substrate, and as for the drive circuit, by forming the TFT of the pixel section with a TFT having a low OFF-current value, which has been described in the Embodiment 3. In this case, it is possible to form, in the drive circuit, a double-layered semiconductor layer overlapped with each other; and, in the pixel section, a double-layered semiconductor layer overlapped with each other. However, since is necessary to carry out doping separately on the semiconductor layers of the upper layers in the double-layered semiconductor layers, another doping mask is required.

Furthermore, different kinds of TFTs may be formed selectively on the same substrate. FIGS. 14A-C show an example of a manufacturing process. FIG. 14A corresponds to FIG. 4A shown in the Embodiment 3; the same reference numerals are given to the same portions. As shown in FIG. 14A, after irradiating laser beam, a patterning of the second semiconductor layer is carried out. In this case, a patterning, in which in the area shown in the left side of the drawing, the second semiconductor layer is formed; in the right side thereof, the second semiconductor layer is not formed. Next, the third insulating film and the first electrode are formed, and the third insulating film is selectively removed using the first electrode as the mask to form the third insulating layer 503. Then, an impurity element for imparting N-type or P-type is doped, and to the semiconductor layer shown at the right side, only the impurity element that imparts N-type is added. The TFT after this doping is shown in FIG. 14B, which corresponds to FIG. 13*c*. In FIGS. 14B and C, the area shown at the left side is the same as those shown in FIGS. 13C and D; the same reference numerals are given to the same portions. Since the following steps are the same as the steps for obtaining the above-described state shown in FIG. 13C to FIG. 13D, the descriptions thereof are omitted here. Thus, as shown in FIG. 14C, in the left side area thereof, a CMOS circuit same as that shown in FIG. 13D, is completed; at the same time, in the right side area thereof, a TFT 600 of double gate constitution is completed. The TFT 600 is comprised of a gate electrode 605, a gate insulating film including the second insulating layer and the third insulating layer 503, a source area or a drain area denoted by the reference numerals 603 and 604, and a source wiring or a drain wiring denoted by the reference numeral 601 and 602.

Example 5

The Example 5 shows an example, in which a CMOS circuit having a constitution different from that of the Embodiment 1, in FIG. 15. FIG. 15A is a sectional view; FIG. 15B is a top view of the CMOS circuit. In the Example 5, the points different from the Embodiments are the facts that: a first insulating film 712 is of a single layer, while a second insulating film is of a double-layered constitution (714a, 714b); the size of the first electrode is different from that of the second electrode; and that an offset area 700 is formed. As for the points other than the above, the step and the constitution thereof are almost the same as those in Embodiment 1, detailed descriptions will be omitted here.

In the Embodiment 1, an example, in which a flattening processing is carried out on the first insulating film, have been described. According to the Example 5, the second insulating film is formed into a double-layered constitution (714a, 714b), and then, the upper layer 714b of the second insulating film is formed by carrying out a flattening processing. As for the flattening processing, after forming a coating film (resist film or the like), etch back method or chemical-mechanical polishing (CMP) or the like may be used.

Further, according to the Example 5, the width of the first electrode 711 in the channel length direction is different from that of the second electrode 719. Since the second electrode 719 is used as the doping mask, the channel length of the channel forming area 728 becomes L1 causing the channel length of the channel forming area 729 L2. Additionally, an offset area 700 is formed between the source area or the drain area and the channel forming area 728. By forming the offset area 700, leak current is reduced.

Accordingly, the N-channel type TFT according to the Example 5 is an inversed stagger type TFT comprises a the first electrode 711 as the gate electrode, the channel forming area 728, the offset area 700 connected with the channel forming area 728, the source area and the drain area, a source wirings 726, 727 connected to the source area or the drain area and a drain wiring 725.

Furthermore, the Example 5 can be combined with any of the Embodiments 1-3, or Embodiments 1-4 freely.

Example 6

In the Example 6, an example, in which an impurity element for imparting P-type to the first semiconductor layer is added; while an impurity element for imparting N-type to the second semiconductor layer is added, is shown in FIG. 16.

In the Example 6, since the steps are almost the same as those shown in FIGS. 1A-D and the constitution also is almost the same, only the points different therefrom will be described below.

In the doping step, an impurity element (boron) for imparting P-type to the first semiconductor layer is added using a second electrode 819 as the mask; while, an impurity element (phosphorous or the like) for imparting N-type to the second semiconductor layer is added. By appropriately setting the doping conditions, the respective elements may be added. Also, according to the Example 6, the doping may be carried out simultaneously. Since boron is smaller in atom radius than the phosphorous, boron is injected deeper into the film. When the elements are added using the same acceleration voltage, it is possible to add the phosphorous to the second semiconductor layer, while, to add the boron to the first semiconductor layer.

Figures 16A, 16B, 16C:
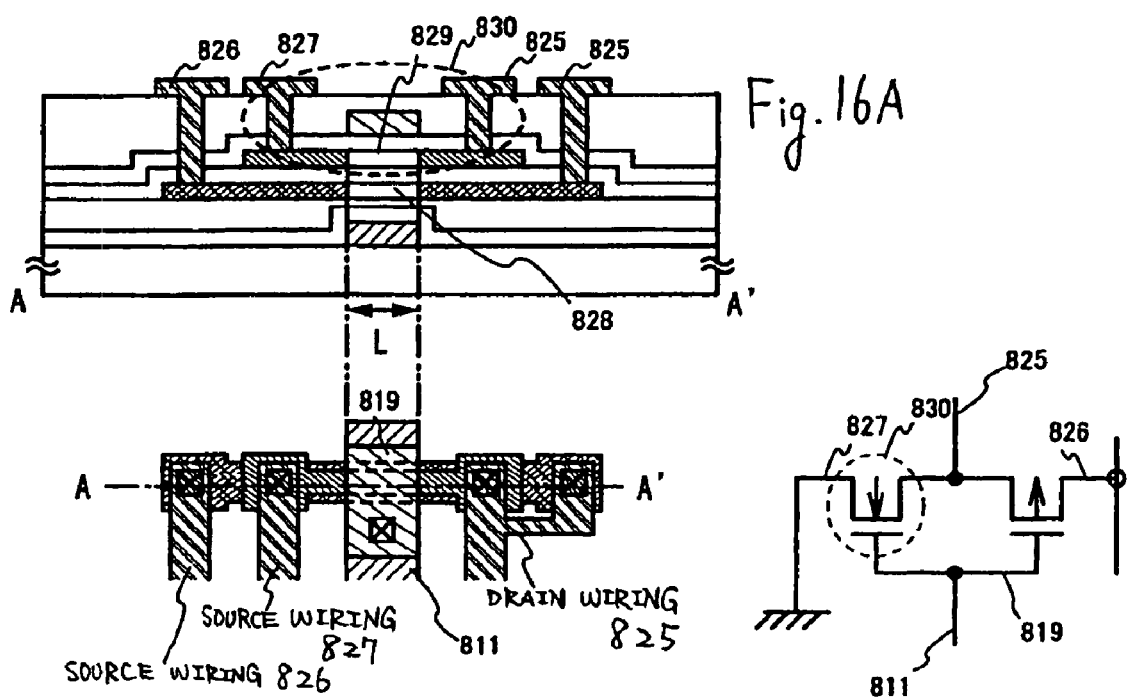
FIGS. 16A to 16C are illustrations showing Embodiment 6.

By following the steps in Embodiment 1 other than the doping step, a CMOS circuit shown in FIG. 16A is completed. A TFT 830, which has a top gate constitution comprised of the second electrode 819 as the gate electrode and the second semiconductor layer as the active layer, is an N-channel type TFT. While, The TFT, which has an inversed stagger structure comprised of the first electrode 811 as gate electrode and the first semiconductor layer as the active layer, is a P-channel type TFT. Reference numeral 827 denotes a source wiring for the above-described N-channel type TFT; 826 denote a source wiring for the above-described P-channel type TFT.

FIG. 16B shows an example of a top view. A sectional view taken along the chain line A-A' in FIG. 16B corresponds to FIG. 16A.

The drain areas of these two TFTs are electrically connected to the drain wiring 825. By combining with the above-described N-channel type TFT 830 so as to be complementary each other, a CMOS circuit can be formed. FIG. 16C shows an example of an equivalent circuit diagram when a CMOS circuit is formed.

The Example 6 can be combined with the any of the Embodiments 1-3, and Examples 1-5 freely.

Example 7

A drive circuit or a pixel section formed by implementing the invention enables to achieve miniaturization, reduction in weight or high precision of various module (active matrix type liquid crystal module, active matrix type EL module and active matrix type EC module). That is to say, by implementing the invention, every electronic apparatus incorporated with those devices is completed.

As for examples of electronic apparatus, a video camera, a digital camera, a head mount display (goggle-type display), a car navigation, a projector, a car stereo, a personal computer, a portable information terminal (mobile computer, cellular phone handset or electronic book or the like) and the like are given. A part of theses examples are shown in FIG. 17-FIG. 19.

FIG. 17A shows a personal computer; a main body 2001, an image input section 2002, a display section 2003, a keyboard 2004 or the like are included therein. According to the invention, since the area of frame rim is reduced, the entire size can be formed further compactly. Further, according to the invention, since it is possible to form the size of each pixel further smaller, it is possible to achieve a high precise display.

FIG. 17B shows a video camera; a main body 2101, a display section 2102, an voice input section 2103, operation switches 2104, a battery 2105, an image receiving section 2106 and the like are included therein.

FIG. 17C shows a mobile computer; a main body 2201, a camera section 2202, an image receiving section 2203, an operation switch 2204, a display section 2205 and the like are included therein.

FIG. 17D shows a goggle type display; a main body 2301, display sections 2302, arm sections 2303 and the like are included therein.

FIG. 17E shows a player that uses a recording medium (hereinafter, referred to as recording medium) stored with a program; a main body 2401, a display section 2402, a speaker section 2403, a recording medium 2404, operation switches 2405 and the like are included therein. The player uses a DVD (Digital Versatile Disc), CD or the like as a recording medium to allow music listening, viewing movies, games and Internet.

FIG. 17F is a digital camera; a main body 2501, a display section 2502, an eyepiece section 2503, operation switches 2504, an image receiving section (not shown in the Figure) and the like are included therein.

FIG. 18A is a front type projector; a projecting unit 2601, a screen 2602 and the like are included therein. By applying the Example 3 to a liquid crystal module 2808 constituting a part of the projector 2601, the entire apparatus thereof can be achieved. According to the invention, since it is possible to miniaturize the size of each pixel, a high precise display section can be achieved. Additionally, according to the invention, it is possible to increase the aperture ratio.

FIG. 18B is a rear type projector; a main body 2701, a projecting unit 2702, a mirror 2703, a screen 2704 or the like are included therein. By applying the Example 3 to a liquid crystal module 2808 constituting a part of the projecting unit 2702, the entire apparatus can be achieved. According to the invention, since it is possible to miniaturize the size of each pixel, a high precise display section can be achieved. Additionally, according to the invention, it is possible to increase the aperture ratio.

FIG. 18C shows an example of the structure of the projecting units 2601 and 2702 shown in FIG. 18A and FIG. 18B. The projecting units 2601 and 2702 comprises a light source optical system 2801, mirrors 2802 and 2804-2806, a diachronic mirror 2803, a prism 2807, a liquid crystal module 2808, a phase shift film 2809 and a projection optical system 2810. The projection optical system 2810 comprises an optical system including a projection lens. Although this example is exemplified by a triple-plate type, the same is not limited thereto, but for example, a single type is also applicable. Further, in the light passes indicated with the arrows in FIG. 18C, an optical system such as an optical lens, a film having a polarizing function, a film for adapting phase shift, an IR film or the like may be provided appropriately by a practitioner of the invention.

FIG. 18D shows an example of the structure of the light source optical system 2801 shown in FIG. 18C. In this example, the light source optical system 2801 comprises a reflector 2811, a light source 2812, lens eyes 2813 and 2814, a polarizing conversion element 2815 and a beam-condensing lens 2816. Since the light source optical system shown in FIG. 18D is given as just an example, the same is not limited thereto. For example, an optical system such as an optical lens, a film having polarizing function, a film adapting phase shift, an IR film or the like may provide to the light source optical system appropriately by a practitioner of the invention.

In the projector shown in FIG. 18, only a case that a transmission type electrooptical device is used is described. No example of application using a reflection type electrooptical device or EL module is given.

Figure 19A:
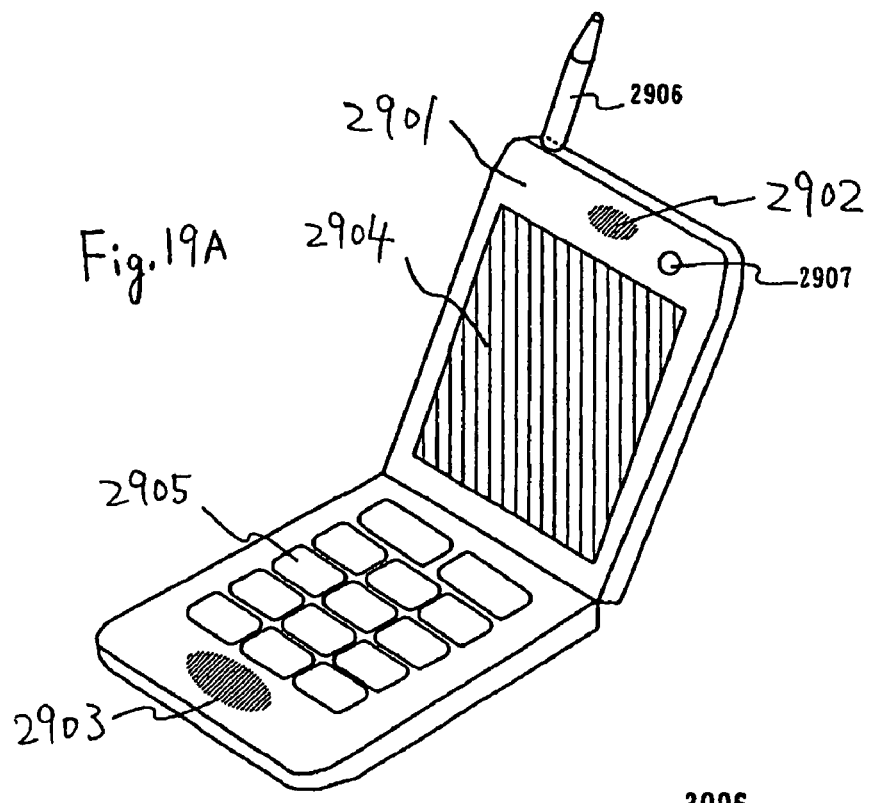
FIGS. 19A to 19C are illustrations showing examples of electronic apparatus.

FIG. 19A shows a cellular phone handset; a main body 2901, an voice output section 2902, an voice input section 2903, a display section 2904, an operation switch 2905, an antenna 2906, an image input section (CCD, image sensor or the like) 2907 and the like are include therein. According to the invention, since the area of the frame rim is miniaturized, the entire size thereof can be formed further compact and light weigh. Further, according to the invention, since it is possible to form the size of each pixel further smaller, a high precise display can be achieved.

Figure 19B:
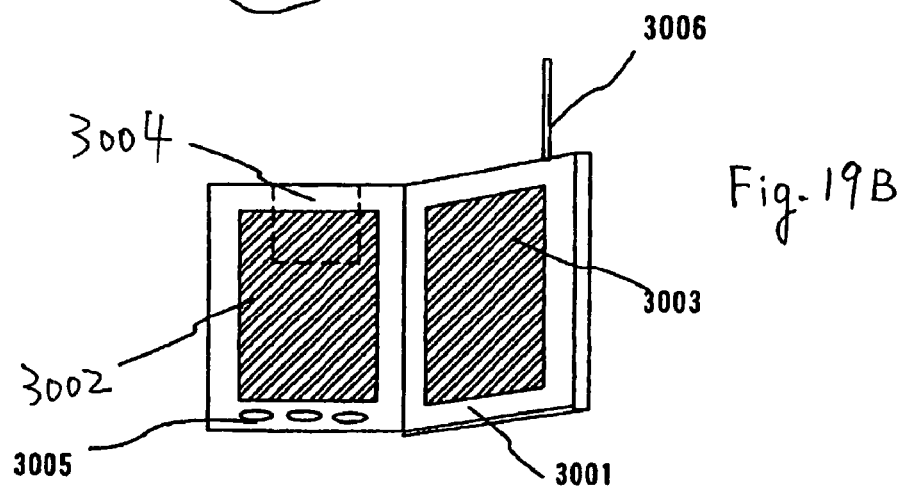

FIG. 19B shows a portable book (electronic book); a main body 3001, display sections 3002 and 3003, a memory medium 3004, operation switches 3005, an antenna 3006 and the like are included therein.

Figure 19C:
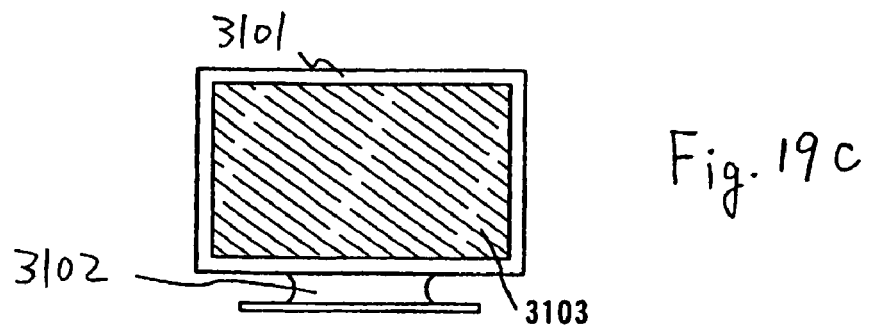

FIG. 19C shows a display; a main body 3101, a support base 3102, a display section 3103 and the like are included therein.

The display shown in FIG. 19C is a medium-small size or a large size one; for example, having a screen size of 5-20 inch. To constitute a display section having this size, it is preferred that, using a substrate of 1 m in edge length, a mass production in a manner of multiple products is carried out.

As described above, the application range of the invention is extremely wide, it is possible to apply to the manufacturing method of electronic apparatus in various field. Furthermore, the electronic apparatus according to the Example can be achieved by using any combination of the Embodiments 1-3 and the Examples 1-6.

According to the invention, it is possible to realize a high performance semiconductor device, in which a plurality of TFTs is highly integrated in three-dimension on a substrate having an insulated surface using relatively small number of masks.

Also, according to the invention, it is possible to largely miniaturize the area occupied by the CMOS circuit formed on the substrate having an insulated surface. Additionally, it is possible to complete the CMOS circuit according to the invention, of which occupied area is largely miniaturized, using six or seven masks used during manufacturing thereof.

Further, according to the invention, since the area occupied by a plurality of TFTs formed on a substrate having an insulated surface is largely miniaturized, it is possible to expand the layout margin.

Accordingly, in a display device exemplified by a light-emitting device or the like having liquid crystal display device or an OLED, in any of pixel section or drive circuit, or in both of the areas, it is possible to miniaturize the occupied area (area occupied by a plurality of TFT) in the horizontal direction.

Furthermore, according to the invention, since it is made possible to make the size of each pixel further smaller, a high precise display device can be realized. Still further, according to the invention, since the occupied area of the plurality of TFT can be largely miniaturized, it is possible to provide a plurality of TFTs and various circuits in one pixel.

What is claimed is:

1. A manufacturing method of a semiconductor device, comprising:
   forming a first semiconductor film over a substrate,
   forming a first insulating film over the first semiconductor film,
   forming a second semiconductor film over the first insulating film,
   irradiating a laser beam to the first semiconductor film having amorphous structure and the second semiconductor film having amorphous structure to form a first semiconductor film having crystal structure and a second semiconductor film having crystal structure simultaneously, and
   forming a second insulating film over the second semiconductor film,
   wherein crystallinity of the first semiconductor film is different from that of the second semiconductor film, and
   wherein the substrate is a glass substrate, a quartz substrate, a ceramic substrate, or a plastic substrate.

2. A method according to claim 1, wherein the laser beam is a light having a wavelength range of 400 nm-800 nm.

3. A method according to claim 1, wherein the laser beam is light output from a continuous oscillation type solid-state laser.

4. A method according to claim 1, wherein in the irradiation of the laser beam, a part of the laser beam passes through the second semiconductor film having amorphous structure, and further passes through the first insulating film and is absorbed by the first semiconductor film having amorphous structure.

5. A method according to claim 1, further comprising:
   forming a gate electrode over the second insulating film,
   adding an impurity element for imparting N-type or P-type to the first semiconductor film having crystal structure using the gate electrode as a mask.

* * * * *